United States Patent
Norman et al.

(10) Patent No.: US 12,242,759 B2
(45) Date of Patent: *Mar. 4, 2025

(54) QUASI-VOLATILE MEMORY DEVICE WITH A BACK-CHANNEL USAGE

(71) Applicant: SunRise Memory Corporation, San Jose, CA (US)

(72) Inventors: Robert D. Norman, Pendleton, OR (US); Eli Harari, Saratoga, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/432,930

(22) Filed: Feb. 5, 2024

(65) Prior Publication Data
US 2024/0176546 A1    May 30, 2024

Related U.S. Application Data

(63) Continuation of application No. 17/688,095, filed on Mar. 7, 2022, now Pat. No. 11,954,363, which is a (Continued)

(51) Int. Cl.
*G06F 3/06* (2006.01)
*G06F 11/10* (2006.01)
(Continued)

(52) U.S. Cl.
CPC .......... *G06F 3/0659* (2013.01); *G06F 3/0604* (2013.01); *G06F 3/0679* (2013.01); *G06F 11/1068* (2013.01); *G06F 13/4027* (2013.01); *G06F 13/4282* (2013.01); *G06F 16/188* (2019.01); *H01L 25/0657* (2013.01); *H01L 25/18* (2013.01); *G06F 2213/0026* (2013.01); *H01L 2225/06541* (2013.01)

(58) Field of Classification Search
CPC ............... G06F 13/4282; G06F 3/0659; G06F 11/1048; G06F 11/1068; G06F 13/4027; G06F 3/0604; G06F 3/0679; H01L 25/0652; H01L 25/0657; H01L 25/18
See application file for complete search history.

(56) References Cited

U.S. PATENT DOCUMENTS 11,301,172 B2 *  4/2022  Norman .................. H01L 25/18
11,954,363 B2 *  4/2024  Norman ................ G06F 3/0604

* cited by examiner

*Primary Examiner* — Guy J Lamarre
(74) *Attorney, Agent, or Firm* — Edward C. Kwok; VLP Law Group LLP

(57) ABSTRACT

A quasi-volatile memory (QV memory) stack includes at least one semiconductor die, having formed thereon QV memory circuits, bonded to a second semiconductor on which a memory controller for the QV memory ("QV memory controller") is formed. The circuits in the bonded semiconductor dies are electrically connected using numerous copper interconnect conductors and conductive through-silicon vias (TSVs). The QV memory controller may include one or more interfaces to additional devices ("back-channel devices") to enable the QV memory controller to also serve as a controller for each back-channel device and to provide additional services. The QV memory controller performs data transfers between a back-channel device and the QV memory without intervention by the host CPU.

40 Claims, 19 Drawing Sheets

Related U.S. Application Data continuation of application No. 16/843,769, filed on Apr. 8, 2020, now Pat. No. 11,301,172.

(60) Provisional application No. 62/867,604, filed on Jun. 27, 2019, provisional application No. 62/831,611, filed on Apr. 9, 2019.

(51) Int. Cl.
*G06F 13/40* (2006.01)
*G06F 13/42* (2006.01)
*G06F 16/188* (2019.01)
*H01L 25/065* (2023.01)
*H01L 25/18* (2023.01)

QUASI-VOLATILE MEMORY DEVICE WITH A BACK-CHANNEL USAGE

CROSS REFERENCE TO RELATED APPLICATIONS

The present invention is a continuation application of U.S. patent application ("Parent Application"), Ser. No. 17/688,095, entitled "Quasi-volatile Memory Device with a Back-Channel Usage," filed on Mar. 7, 2022, which is a continuation application of U.S. patent application ("Parent Application"), Ser. No. 16/843,769, entitled "Quasi-volatile Memory Device with a Back-Channel Usage," filed on Apr. 8, 2020, which is related to and claims priority of (i) U.S. provisional patent application ("Provisional Application I", Ser. No. 62/831,611, entitled "QV memory with a Back-Channel Usage," filed on Apr. 9, 2019; and (ii) U.S. provisional patent application ("Provisional Application VII"), Ser. No. 62/867,604, entitled "Quasi-Volatile Memory (QV memory) Device with a Back-Channel Usage," filed on Jun. 27, 2019.

The present application is also related to (i) U.S. provisional application ("Provisional Application II"), Ser. No. 62/735,678, entitled "Wafer Bonding in Fabrication of 3-Dimensional NOR-memory Circuits," filed on Sep. 24, 2018; and (ii) U.S. provisional application ("Provisional Application III"), Ser. No. 62/843,733, entitled "Device with Embedded High-Bandwidth, High-Capacity Memory using Wafer Bonding," filed on Mau 6, 2019.

The present invention is also related to U.S. patent application ("Non-Provisional Application I"), Ser. No. 16/107,306, entitled "Capacitive-Coupled Non-Volatile Thin-Film Transistor Strings in Three Dimensional Arrays," filed on Aug. 21, 2018, which is a divisional application of U.S. non-provisional patent application ("Non-provisional Application II"), Ser. No. 15/248,420, entitled "Capacitive-Coupled Non-Volatile Thin-Film Transistor Strings in Three Dimensional Arrays," filed on Aug. 26, 2016, which is related to and claims priority of (i) U.S. provisional application ("Provisional Application IV"), Ser. No. 62/235,322, entitled "Multi-gate NOR Flash Thin-film Transistor Strings Arranged in Stacked Horizontal Active Strips With Vertical Control Gates," filed on Sep. 30, 2015; (ii) U.S. provisional patent application ("Provisional Application V"), Ser. No. 62/260,137, entitled "Three-dimensional Vertical NOR Flash Thin-film Transistor Strings," filed on Nov. 25, 2015; (iii) U.S. non-provisional patent application ("Non-Provisional Application III"), Ser. No. 15/220,375, "Multi-Gate NOR Flash Thin-film Transistor Strings Arranged in Stacked Horizontal Active Strips With Vertical Control Gates," filed on Jul. 26, 2016; and (vi) U.S. provisional patent application ("Provisional Application VI"), Ser. No. 62/363,189, entitled "Capacitive Coupled Non-Volatile Thin-film Transistor Strings," filed Jul. 15, 2016. The disclosures of Parent Application, Provisional Applications I-VII and Non-Provisional Patent Applications I-III are hereby incorporated by reference in their entireties.

BACKGROUND OF THE INVENTION

1. Field of the Invention

The present invention relates generally to integrated circuits ("chips"), such as processors and main-store memory technology. More specifically, the present invention relates to operations and usage modes of enhanced random-access memory (RAM) chips.

2. Discussion of the Related Art

A typical computer system may include one or more central processing units (CPUs), with each CPU having one or more cores. In addition, such a computer system typically also includes other components that extend the capabilities of the CPUs, such as a memory controller that stores and fetches data from a RAM over a memory bus. Many other buses and devices may perform various other types of desired functions.

In one architecture, two devices (collectively, the "chipset") connect the CPU to the supporting devices. Typically, the devices are referred to as the "North Bridge" and the "South Bridge." The North Bridge hosts the high-speed memory controller and port to the RAM, which may be implemented by dual in-line memory modules (DIMMs). In addition, a video channel is also typically present. Recently, some designs integrate the North Bridge into the CPU itself. The South Bridge supports peripheral devices ("peripherals") that carry out slower transactions (e.g., input or output (I/O) transactions). The South Bridge may include a boot memory port associated with a non-volatile memory and a disk port (e.g., a disk port that conforms to the ATA or SATA protocols) for communicating with a storage system. The South Bridge also supports other I/O ports (e.g., universal serial bus or "USB"), such as various dedicated controllers, often over one or more industry standard peripheral buses (e.g., the PCIe bus). One example of a controller is the Network Interface Card (NIC), which conducts data communication with a computer network (e.g., the Internet) over an ethernet connection. The NIC supports I/O transactions between the local system and remote systems (the "cloud"), such as data in a remote system being transferred into the local system's RAM or local data being transferred out of the local system's RAM to a remote system. A NIC I/O transaction is performed, for example, when a browser retrieves an image or a file for display from the cloud.

In higher-end systems, a dedicated disk interface card is typically provided for communication with storage in local and remote networks. The disk interface card may be implemented, for example, by fiber channel for a storage area network (SAN) or by ethernet for network-attached storage (NAS). Other examples include devices that conform to the SATA, ATA, SCSI, SAS, InfiniBand, and other interface protocols. The CPU usually communicates with the disk interface card over an industry-standard interface (e.g., the PCIe interface).

The devices described above constitute building blocks that enable systems of many levels of sophistication—from simple devices (e.g., laptops) to high-end servers associated with highly specialized applications and very sophisticated capabilities. These systems span a spectrum of platforms differentiated by speed, hardware complexities, operating systems and application software.

Historically, higher performance demands have typically been met by ever-improving clock speeds and reduction in feature sizes, enabled primarily by advances in process technology. This approach may be reaching its limits—i.e., circuits of greater speeds and higher density with each successive generation of technology can no longer be taken for granted. Improved performance has been achieved increasingly with a greater emphasis on CPU architecture, such as adding processing cores to run more concurrent processes. However, few notable improvements have been made to address power dissipation and data transfer bottlenecks into and out of the CPU.

RAM is essential to achieving high performance. Memory speeds and throughputs, however, have not kept up with CPU demands. For example, performance degradation is often encountered in data handled through external ports and slower and higher latency memory devices. In this regard, some relief may be achieved by increasing the size of the CPU cache. However, CPU caches have recently become so large that the benefit of further increases in size is seen diminishing. Nonetheless, memory interface standard groups are constantly pushing for higher memory access speed and throughput. For example, the common dynamic RAM ("DRAM") interface, referred to as the Double Data-Rate (DDR) interfaces, takes on successive specifications of increasing memory speeds and throughputs—i.e., DDR1, DDR2, DDR3, DDR4 and DDR5. These specifications have been met through process technology—i.e., fabricating the memory components and their controller devices in successively higher performance processes—which, too, is facing its limits.

Other approaches include off-loading or simplifying CPU operations to achieve greater system performance. One approach moves CPU processes "outbound." For example, for files that are encrypted for security and stored on the cloud, the encryption task is taken from the CPU and its associated RAM, and off-loaded to an accelerator board, which receives, encrypts and forwards the file for storage in the cloud. Data is typically transferred into and out of the main memory via direct memory access (DMA) circuitry. Inefficiencies still remain from the CPU's involvement in supervising memory-related data transfer activities.

FIG. 1 illustrates exemplary computer system 100 of conventional architecture. As shown in FIG. 1, CPU 101 connects to high-speed memory 106 (e.g., DRAM) over one or more high speed-channels incorporated in North Bridge 102. In addition, CPU 101 further accesses data in peripheral devices (e.g., storage or network connections) over one or more peripheral buses (e.g., a PCIe bus). South Bridge 103 may include, for example, a DMA controller that transfers data between these devices and high-speed memory 106. The operational speed achievable in computer system 100—which may be a server—depends how quickly data is moved.

In computer system 100, an operating system allocates time to each application or operating system process to run CPU 101. Under this arrangement, each process runs for up to its time allocation, unless it is suspended to wait for a data transfer to complete or preempted by a higher priority process. In either instance, CPU 101 is yielded to another process in a "context switch." (Typically, an application process is assigned a lower priority than a system process.) In this approach, the size of high-speed memory 106 is an inherent bottleneck, the run-time image of the new process may have to be loaded into high-speed memory 106 in a context switch. Conventional capacitor-based DRAM chips may have reached—or close to reaching—process technology limits, making it difficult for further increase in density to meet the expected greater workload. Without increased density, the required number of DRAM chips necessary to meet the expected workload presents a challenge in designing for the electrical characteristics of the memory channels.

One proposed, alternative approach replaces a portion of high-speed memory 106 with a type of non-volatile memory devices known as "persistent memory" devices. Persistent memory devices are of a much higher density than conventional DRAM devices and retain data even when power is interrupted. In addition, persistent memory devices do not require block management to perform routine erase operations and provide much faster data access than conventional non-volatile memory devices (e.g., flash memory devices). However, even though their read and write characteristics excel over conventional non-volatile memory devices, persistent memory devices are still significantly slower than conventional DRAM devices. Consequently, to coexist with DRAM devices in a system, a persistent memory and the DRAM-implemented high-speed memory must be provided separate channels to accommodate their timing difference. Typically, for these channels, separate memory controllers are required, as switching between the devices dynamically in a single controller is not generally available. FIG. 2 shows computer system 100 of FIG. 1, being adapted to provide DRAM-based high-speed memory 106 and persistent memory 107 on separate channels CH 0 and CH 1, respectively. Even though the advantages of density and data retention offered by persistent memory 107 are significant, these advantages are diminished due to their attendant overhead in system complexity and latency.

Thus, fundamentally different memory designs, operations, and usage modes are desired to achieve greater CPU or system performance.

SUMMARY

According to one embodiment of the present invention, a quasi-volatile memory (QV memory) stack includes at least one semiconductor die, having formed thereon QV memory circuits, bonded to a second semiconductor die on which a memory controller for the QV memory ("QV memory controller") is formed. The circuits in the bonded semiconductor dies are electrically connected using numerous copper interconnect conductors and conductive through-silicon vias (TSVs). The QV memory controller may include one or more interfaces to additional devices ("back-channel devices") to enable the QV memory controller to also serve as a controller for each back-channel device and to provide additional services. The QV memory controller performs data transfers between a back-channel device and the QV memory without intervention by the host CPU.

According to one embodiment of the present invention, a memory module includes (a) a first semiconductor die, having formed thereon a first set of one or more quasi-volatile memory arrays ("QV memory arrays") and a first group of interconnect conductors for sending and receiving data and control signals associated with reading, writing or erasing of the QV memory arrays; and (b) a second semiconductor die bonded to the first semiconductor die, the second semiconductor die having formed thereon a memory controller circuit including an internal bus connecting the memory controller and the first set of QV memory arrays through the first group of interconnection conductors, and wherein the memory controller sends and receives the data and control signals to access the first set of QV memory arrays during reading, writing or erasing operations. The memory controller may include a host memory interface to allow a host processor to request transactions to be carried out by the memory controller.

According to one embodiment of the present invention, the memory module may further comprising a third semiconductor die substantially the same as the first semiconductor die and bonded to the first semiconductor die, such that the interconnect conductors on the third semiconductor die are connected to the internal bus through some of interconnect conductors of the first semiconductor die and TSVs, so that the memory controller circuit of the second semiconductor die may be connected to the QV memory arrays of the third semiconductor die. In such an arrangement, the memory controller serves as controller to all QV memory arrays in the memory module.

According to one embodiment of the present invention, the memory controller may further include an interface circuit connecting the internal bus and a back-channel device to allow data exchange between the back-channel device and the QV memory arrays in the memory module. In some embodiments, the interface circuit includes multiple ports. In some embodiments, the back-channel device may itself be one or more QV memories each accessed by a different host processor, such as a graphics processing unit (GPU). In those embodiments, the memory controller circuit may perform direct memory-to-memory data transfers between any two of the QV memories in the memory module.

In some embodiments, the back-channel device is a controller for (a) a non-volatile memory (NVM) system; (b) a disk storage system (c) a peripheral interface, and (d) data network interface. The NVM system may be a NAND-type flash memory device and, in some embodiments, the controller for the NVM system may reside on the same semiconductor die as the memory controller. Directory and address translation tables for accessing the NVM system may be maintained in both the QV memory arrays of the memory module and the NVM system itself. The NVM system may store files based on a virtualized file system.

According to one embodiment of the present invention, the back-channel device is a controller for the data network interface, which may be an ethernet interface or a wireless interface. In other embodiments, the back-channel device may be a peripheral interface (e.g., a PCIe interface).

In some embodiments, the memory controller includes a RISC processor and a direct memory access (DMA) circuit for transferring data between or within the QV memory arrays and between the back-channel device and the QV memory arrays. In some embodiments, the memory controller may further include a format circuit between the QV memory arrays and the back-channel device for converting between data formats used in the QV memory arrays and in the back-channel device. The format circuit, and indeed, other circuits in the memory controller may be provided using field programmable gate arrays (FPGAs).

According to some embodiments of the present invention, the memory controller may perform one or more of: journaling, checkpointing, issuing commands to the back-channel device and tracking the status of execution of commands in the back-channel device, data encryption and decryption, data compression and decompression, error code generation, error detection, error correction, error logging and other suitable services, without intervention by the host CPU.

The present invention is better understood upon consideration of the detailed description below in conjunction with the drawings.

BRIEF DESCRIPTION OF THE DRAWINGS

Although the drawings depict various examples of the invention, the invention is not limited by the depicted examples. In the drawings, like reference numerals designate like elements. Also, depictions in the figures are not necessarily to scale.

DETAILED DESCRIPTION OF THE PREFERRED EMBODIMENTS

Figure 1:
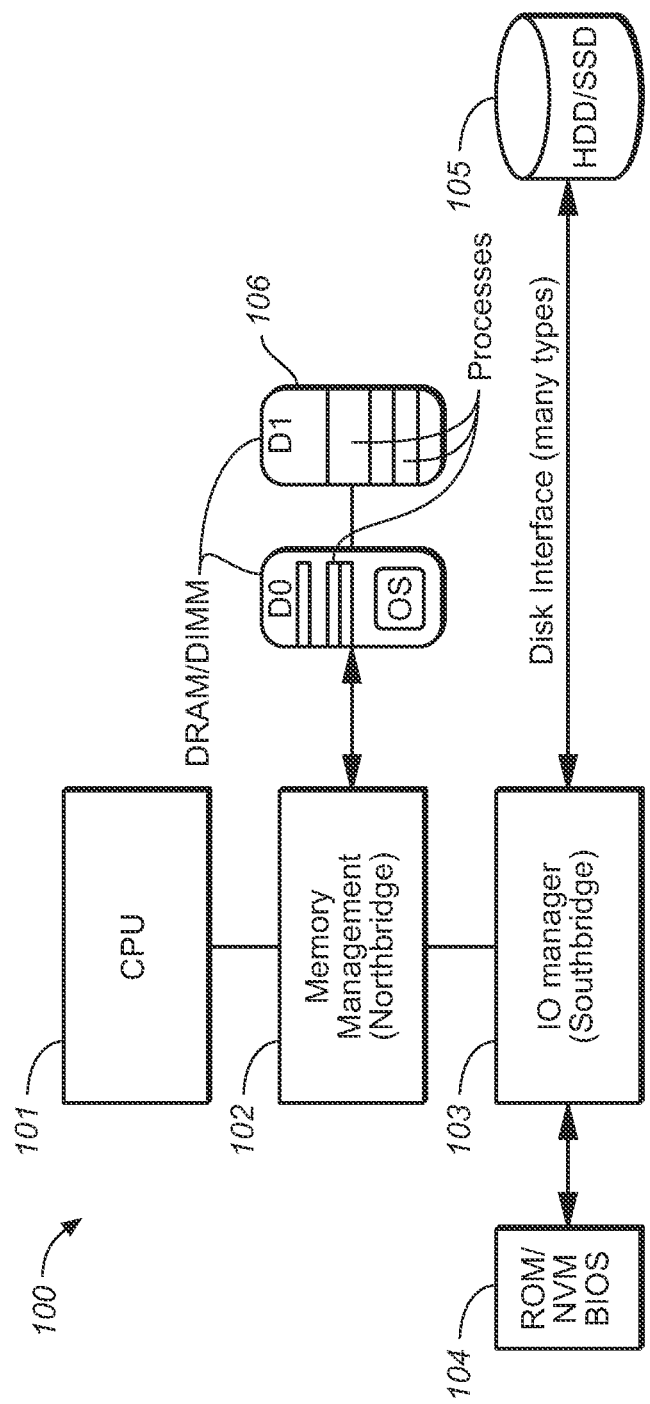
FIG. 1 illustrates exemplary computer System 100 of conventional architecture.
Figure 2:
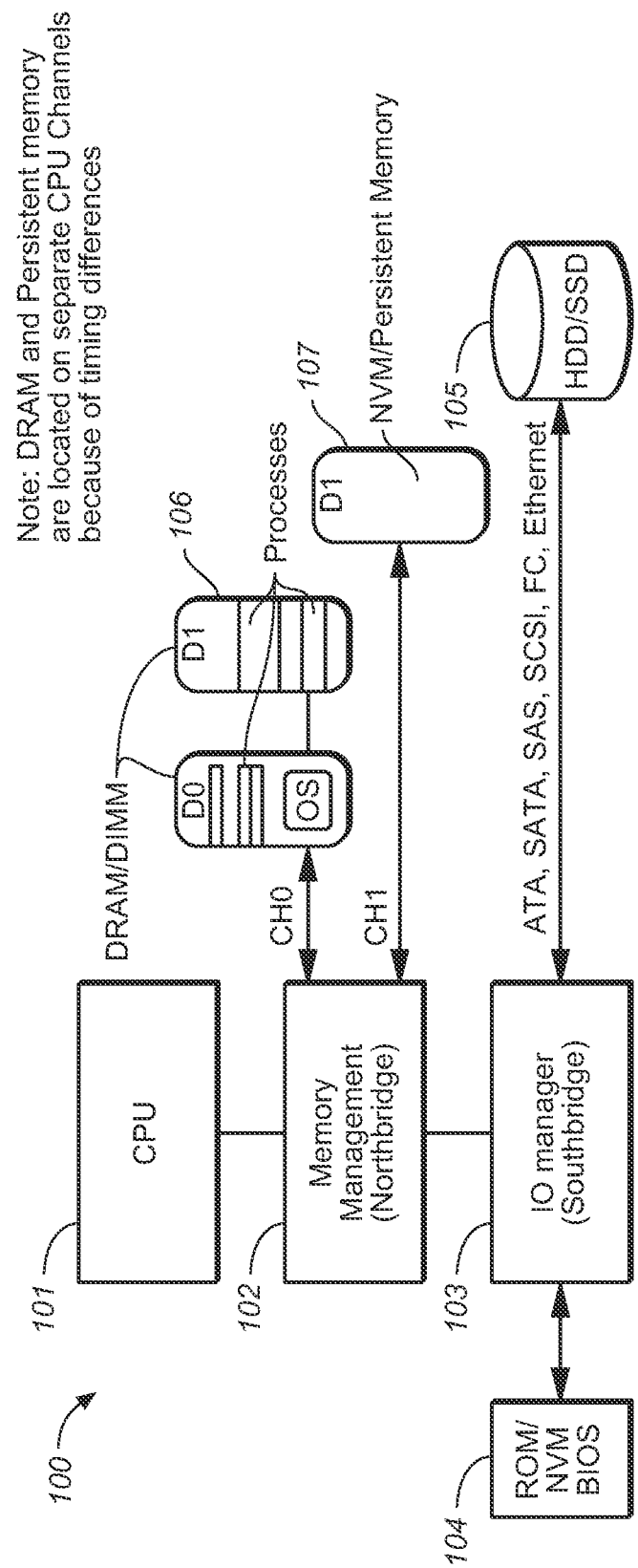
FIG. 2 shows computer system 100 of FIG. 1, being adapted to provide a DRAM-based high-speed memory 106 and persistent memory 107 on separate CPU channels CH0 and CH1, respectively.

Various embodiments and examples may be implemented in numerous ways, including as a system, a process, an apparatus, or a series of program instructions on a suitable computer readable medium (e.g., as a computer readable storage medium, or a computer network where the program instructions are sent over an optical, electronic, or wireless communication link). In general, operations of disclosed processes may be performed in any arbitrary order, unless otherwise specifically provided in the claims.

A detailed description of one or more examples of the present invention is provided below along with accompanying figures. The examples illustrate but without limiting the present invention. The scope of the present invention is set forth in the claims, which encompass numerous alternatives, variations, modifications, and equivalents. Technical material that is known to relate to the examples has not been described in detail to avoid unnecessarily obscuring the description.

In some examples, multiple memory types are integrated into a single component (e.g., a wafer, substrate, or dic). Non-Provisional Application I—which is incorporated herein by reference for all purposes—discloses a memory device that is referred herein as a quasi-volatile memory (QV memory) device. The QV memory device includes a charge-trapping layer (e.g., an oxide-nitride-oxide or "ONO" triple-layer) that is optimized for fast programming and erase operations and for high program/erase-cycle endurance. In some embodiments, the QV memory device may have a relatively short data retention time (e.g., greater than 100 milliseconds, but less than 100 days), such that, for some applications, the QV memory device may require refresh operations from time to time (e.g., 100-millisecond intervals), in a manner similar to the data refresh operations in conventional DRAM devices. A memory built on QV memory devices may replace a conventional DRAM-based memory.

The present invention provides various designs, operations and usage modes in computer systems with a QV memory-based high-speed memory. In one embodiment, the QV memory-based high-speed memory completely replaces a DRAM-based high-speed memory. As QV memory devices have significantly higher density than conventional DRAM devices, a QV memory-based memory has a significantly higher capacity relative to a DRAM-based memory of a comparable footprint (e.g., comparable number of memory chips). Furthermore, as QV memory devices require less frequent refreshes, a QV memory-based memory has a lower power requirement than a DRAM-based memory of comparable capacity. Furthermore, as compared to the current process technology for fabricating DRAMS, the process technology for QV memory devices is more amenable to lithography reduction. In addition, QV memory dies can also be stacked, using available 3-dimensional stacking techniques. For these reasons, conventional DRAM chips lack the capabilities and flexibilities of QV memory chips, and are more costly to produce.

QV memory devices also enable new memory usage modes. In one embodiment, QV memory arrays are provided on one die and supporting memory control circuits may be provided on another die that is wafer-bonded to the QV memory array bonded die. Thus, the memory control circuits may be fabricated using a process that is optimized for logic circuit, thereby achieving a circuit speed higher than is possible using a process optimized for memory circuits. In some embodiments, the memory control circuits may provide a faster memory interface accessible to the rest of the system. One example of a system that includes such a two-die memory system is illustrated in FIG. 3.

Figure 3:
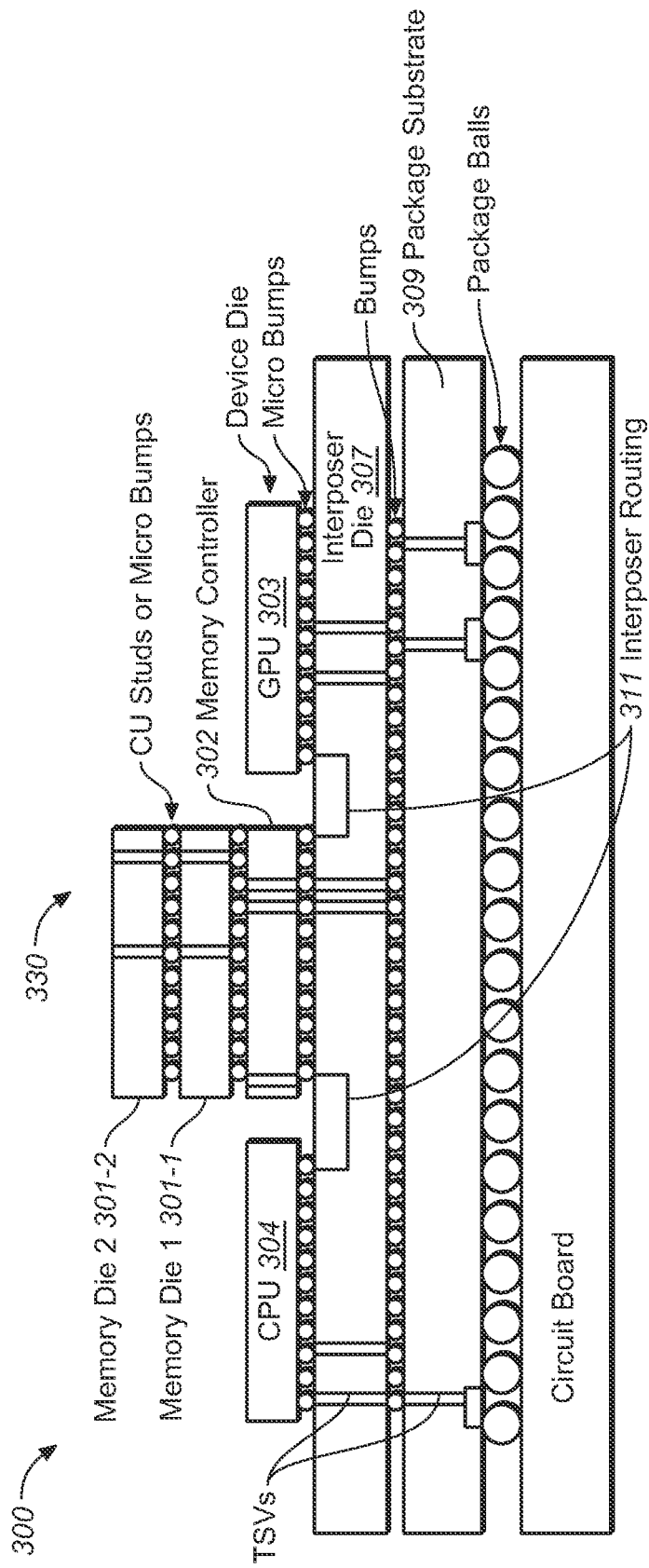
FIG. 3 shows exemplary system 300 that includes memory sub-system ("memory stack") 330, in which memory array dies 301-1 and 301-2 are stacked on and interconnected to memory controller die 302 using a QV memory interface, in accordance with one embodiment of the present invention.

FIG. 3 shows exemplary system 300 that includes memory sub-system ("memory stack") 330, in which memory array dies 301-1 and 301-2 are stacked on and interconnected to memory controller die 302 using copper studs and through-silicon vias, in accordance with one embodiment of the present invention. As shown in FIG. 3, memory array dies 301-1 and 301-2, which may be QV memory dies, may be wafer-bonded or die-bonded to each other and electrically connected using copper studs, as described in Provisional Applications II and III incorporated by reference above. As shown in FIG. 3, memory array dies 301-1 and 301-2 include conductor-filled "through-silicon vias" (TSVs) that run substantially the entire thickness of each die. These TSVs enable further stacking of dies and interconnection across the dies. FIG. 3 shows that memory array dies 301-1 and 301-2 are stacked and bonded to memory controller die 302. Memory controller die 202 may also be electrically connected, as shown in FIG. 3, to memory array dies 301-2 and 301-2 using copper studs and TSVs ("QV memory interface"). In FIG. 3, memory stack 330, CPU 304 and graphical processor unit (GPU) 303 are each connected to interposer die 307 by micro-bumps. Memory stack 330, CPU 304, GPU 303 and interposer die 307 may all be encapsulated in an electronic package that includes package substrate 309. A conductor network in interposer die 307 interconnects the package pins, memory stack 330, CPU 304 and GPU 303. The package may be placed on circuit board 311 (e.g., a computer system "mother-board") with other components (not shown) of system 300.

Because the copper studs are small (e.g., 1 $\mu m^2$) and allow for detailed signaling to occur, memory controller die 302 may include logic circuits that each independently control a different set of memory arrays on memory array dies 301-1 and 301-2. Such an arrangement makes possible customizing different control circuits in memory controller 302 to control different memory arrays on the same memory die under different configurations, thereby allowing new usage modes, such as multiple simultaneous read or write operations. By providing memory arrays and memory control on separate dies, memory stack 330 offers new memory usage modes and architecture possibilities that are difficult to implement under conventional memory architecture. Such an arrangement also makes possible sharing of a memory control logic circuit among numerous memory arrays on different dies. Such sharing of memory control logic circuits among numerous memory arrays improve silicon utilization and thus overall efficiency. Other advantages include a reduced footprint and significantly reduced copper wiring lengths for connecting among memory devices. These advantages allow for lesser drive requirements (hence, reduced power and heat dissipation) and reduced data access latencies, due to reduction in both resistance and capacitance.

Figure 4:
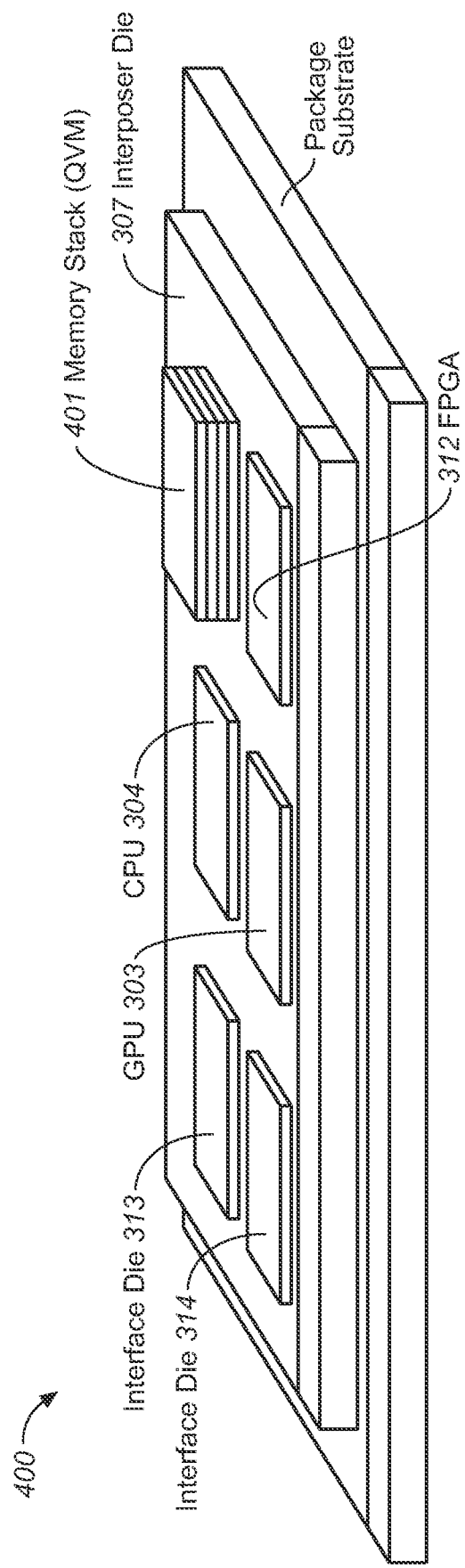
FIG. 4 shows exemplary computer system 400 including interposer die 307 which integrates memory arrays on memory stack 401, interface dies 313 and 314, CPU 304, GPU 303 and field programmable gate array (FPGA) die 312.

Bonding multiple memory dies in a stack provides an efficient way for attaching or otherwise integrating a memory system into a computer system using an interposer die. FIG. 4 shows exemplary computer system 400 including interposer die 307 which integrates memory arrays on memory stack 401, interface dies 313 and 314, CPU 304, GPU 303 and field programmable gate array (FPGA) die 312. Memory stack 401 may include memory controller or controllers for the memory arrays in memory stack 401. As illustrated in FIG. 3, the memory controller or controllers in a memory stack may be provided on a die separate from the dies providing the memory arrays. Interface dies 313 and 314 may each implement one or more industry standard interfaces (e.g., DDR4). Although FIG. 4 shows only a single memory stack being provided on interposer die 307 (i.e., memory stack 401), multiple memory stacks may be provided on interposer die 307. Under this arrangement, the memory arrays in each memory stack (e.g., memory stack 401) may be managed by a separate memory controller. Alternatively, memory arrays of different memory stacks may be managed by the same memory controller, separate from the memory stacks. In either configuration, the memory stacks may be organized into multiple channels, which are each accessible by CPU 304 or GPU 303 through interfaces configured in interface dies 313 and 314. Having all memory arrays in a memory stack accessed through a single memory controller trades-off channel connectivity for efficiency. The mapping of memory stacks to channels may vary according to the rank architecture desired by the designer. Having a memory controller control memory arrays in multiple dies enables each interface circuit to treat such memory arrays as a single load, instead of treating the memory arrays of each die as a separate load. Such a configuration provides many electrical advantages.

When a memory controller in a memory stack controls the memory arrays in the memory stack's multiple memory dies (e.g., having a memory controller on memory controller die 302 of FIG. 3 controls memory arrays in memory dies 301-1 and 301-2), additional capabilities may be readily implemented. For example, a memory-to-memory data transfer among memory arrays within the memory stack (e.g., from a memory array in memory die 301-1 to a memory array in memory die 301-2) may be implemented using a DMA capability internal to the memory controller of the memory stack (e.g., memory controller on memory controller die 302), by including an internal DMA control circuit (such a circuit need not provide all functions of a conventional DMA controller) that includes a transfer counter and internal source and designation registers. The DMA control circuit fetches data from a range of memory addresses beginning at the address in the source register and writes the data back to a corresponding range of memory addresses beginning at the address in the designation register, under control of a state machine (SM) and an address generator circuit. Under this arrangement, the data being transferred is routed through an internal bus of the DMA control circuit, without using any of the interface buses (e.g., industry standard interfaces 313 and 314). Not activating the interface drivers achieves significant power efficiency. Such internal transfers hardly involve host CPU 303, thus saving host CPU cycles and improve overall system performance.

Data integrity is another example of efficiency achieved by having the same memory controller control the memory arrays of multiple dies. To ensure data integrity, most memory circuits implement at least error detection (e.g., parity checking), but more typically error correction (e.g., error correction codes (ECC)) before providing the fetched data to the memory interface. When a memory controller controls the memory arrays of multiple of dies, the error detection and correction circuits may be provided in the memory controller, rather than the memory circuits themselves, thereby saving significant silicon area (e.g., thousands of gates in the check-bit generators and correction circuits). Furthermore, under this approach, as the error detection and correction circuits are to fabricated in a process optimized for logic circuits, rather than memory circuits, faster circuits and reduced latency are also achieved.

Figure 5:
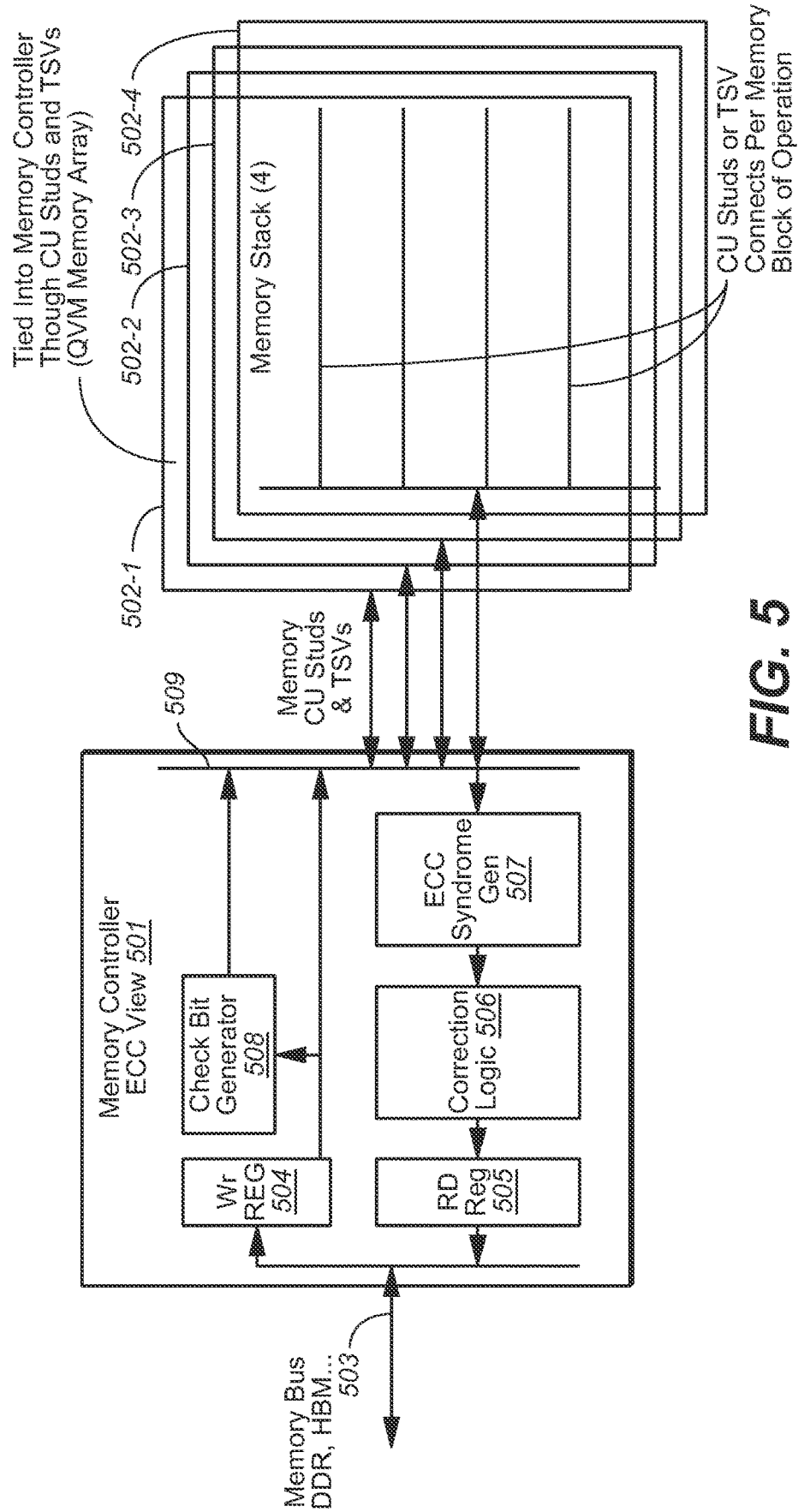
FIG. 5 shows error detection and error correction circuits in memory stack 500, according to one embodiment of the present invention.

FIG. 5 shows error detection and error correction circuits in memory stack 500, according to one embodiment of the present invention. As shown in FIG. 5, memory stack 500 includes memory controller die 501 and memory dies 502-1, 502-2, 502-3 and 502-4. Memory arrays on different memory dies 502-1 to 502-4 may be interconnected with each other or with the circuits of memory controller die 501 over a QV memory interface. A memory controller in memory controller die 501 receives data from memory interface bus 503 into write register 504 and provides read data on memory interface bus 503 from read register 505. Check-bit generator 508 generates error detection codes (e.g., parity bits) that are to be stored alongside the data to be written over internal bus 509 into a memory array in memory dies 502-1 to 502-4. Data read from a memory array in memory dies 502-1 to 502-4 are read from internal bus 509. From this data on internal bus 509, ECC syndrome generator 507 generates a syndrome that indicates necessary corrections, if any. Correction logic circuit 506 implements the corrections indicated by the syndrome and writes the result into read data register 505. Read data register 505 provides the result on memory interface bus 503.

Figure 6:
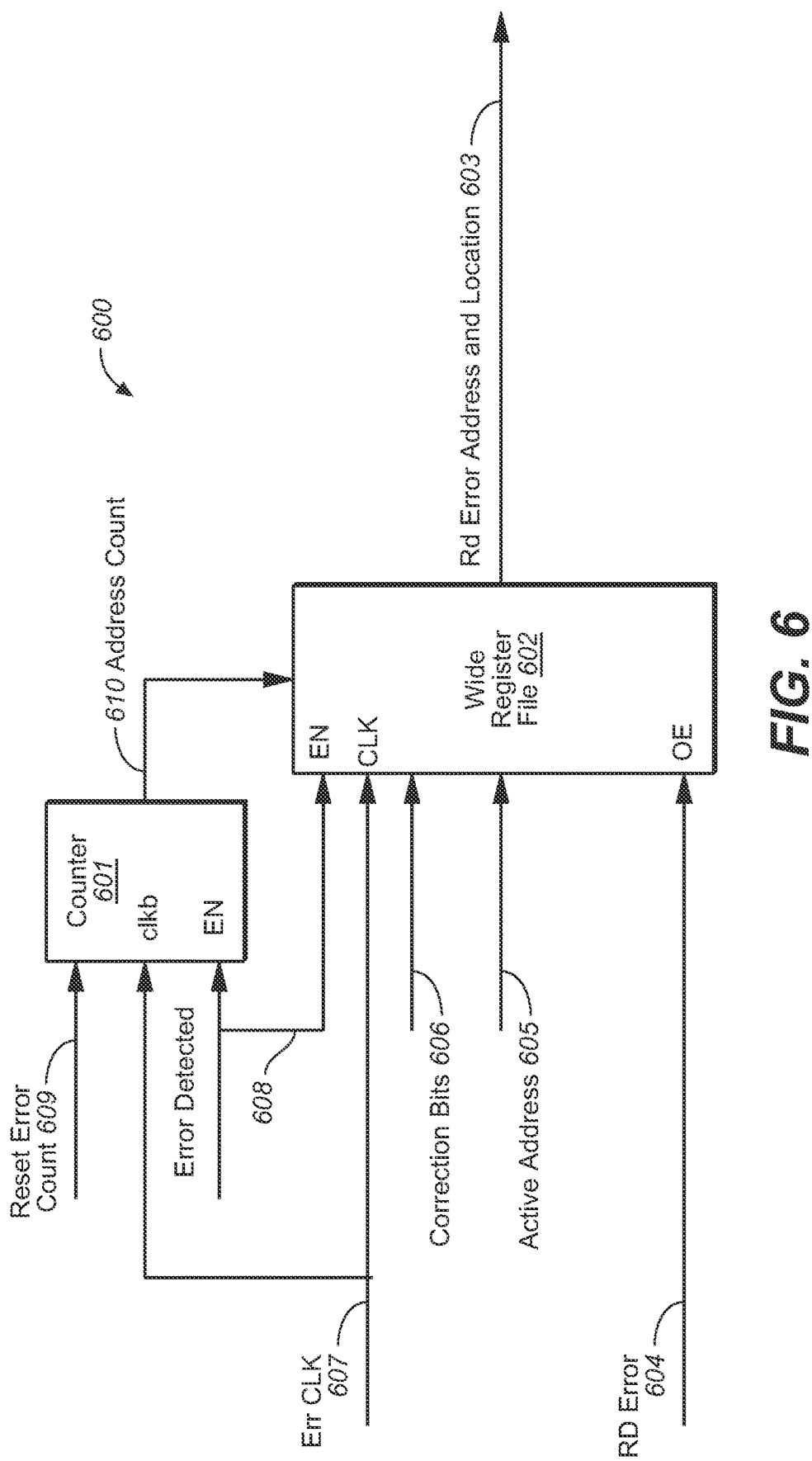
FIG. 6 is a block diagram of exemplary error logging circuit 600 including error counter 601 and register file 602, in accordance with one embodiment of the present invention.

With error detection and correction residing in the memory controller, logging of all errors is feasible, thereby allowing potential troubled locations in the memory be flagged. FIG. 6 is a block diagram of exemplary error logging circuit 600 including error counter 601 and register file 602, in accordance with one embodiment of the present invention. As shown in FIG. 6, when error detected signal 608 is asserted, error counter 601 and register file 602 are enabled. As a result, the next transition in error clock signal 607 increments error log offset value 610 to point to the next location in the error log to write the next entry. That next transition of error clock signal 607 also latches into register file 602 the location in memory of the data which causes the current error, which is provided on address bus 605. Register file 602 also latches correction bits word 606, which indicates the bits of the memory at which correction was required. When read error signal 606 is asserted shortly following the transition in error clock signal 607, register file 602 outputs on bus 603, the address where the error occurs, the correct bits word and the next location in the error log at which the error should be logged. Any location appearing in the error log represents a potential troubled location. Reset error count signal 609 is asserted when it becomes necessary or desirable to reset the next location to the first entry of the error log.

With a map of the potential troubled locations, a system or memory controller may swap the potential troubled locations for programmable back-up redundant replacement circuitry that are typically set aside for redundancy. In some embodiments, such redundant replacement circuitry may be swapped in by one-time programmable memory (OTP), NVM, or registers that are booted with error pointers at power-on. At present, there is not a uniform standard for implementing redundancy in memory and designers are free to implement their own redundancy scheme. For example, redundancy mapping may be accomplished for a QV memory during a refresh cycle when no system access is expected to be carried out. (For a QV memory, configuration changes during a refresh cycle avoid interruption to functional usage and avoids a need for scheduled maintenance down time. In addition, interruptions to functional operations are avoided by the rapid removal of the potential troubled locations.

Figure 7:
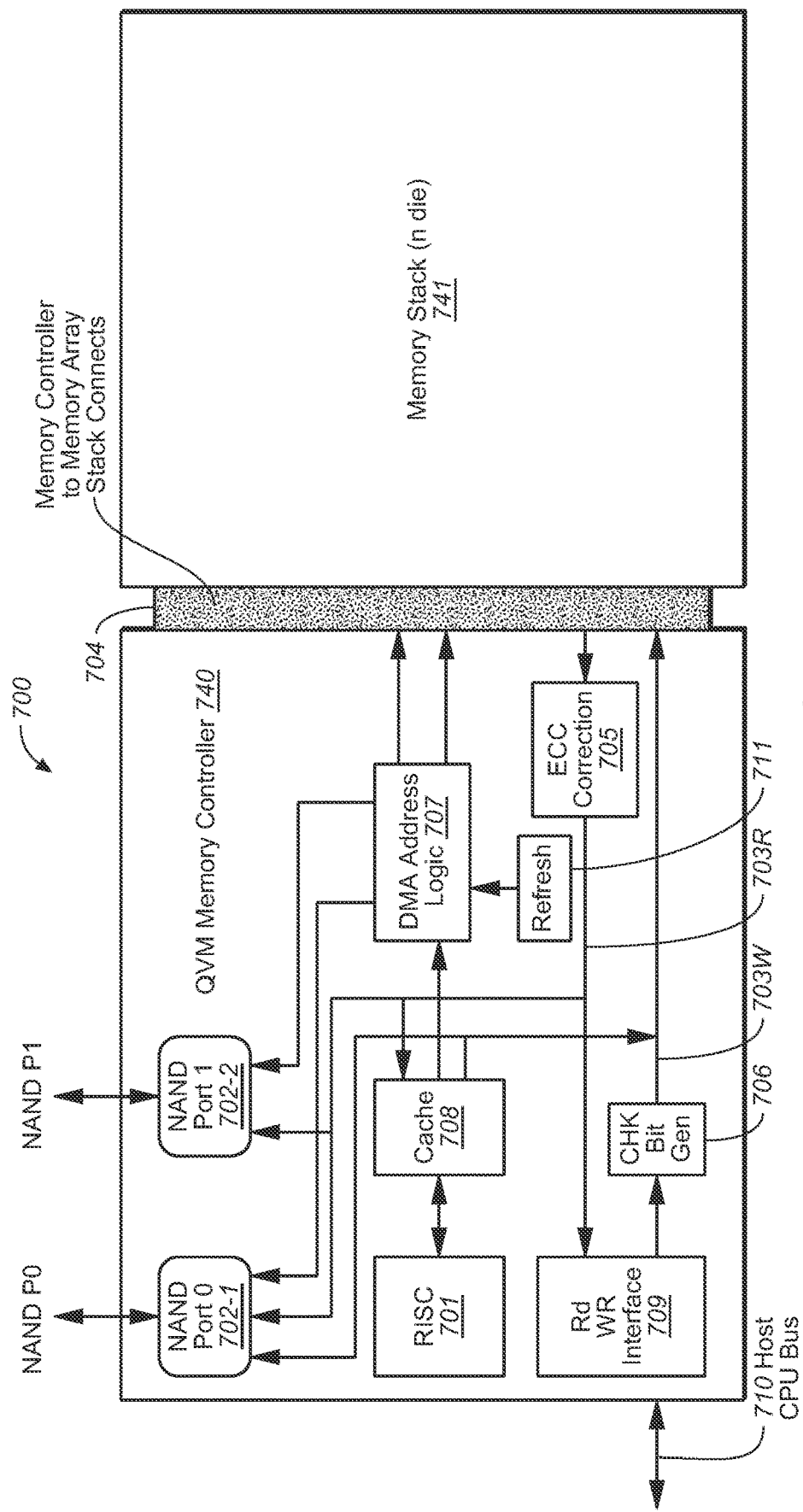
FIG. 7 shows memory controller 740 of memory stack 700, including reduced instruction set computer (RISC) processor 701 and NVM interfaces 702-1 and 702, in accordance with one embodiment of the present invention.

In some embodiments, the memory controller die of a memory stack and each memory die in that memory stack have substantially the same silicon area. Consequently, the memory controller die may have substantial die area to allow incorporation of additional non-conventional logic circuitry into the one or more memory controllers on the die. FIG. 7 shows memory controller 740 of memory stack 700, including reduced instruction set computer (RISC) processor 701 and NVM interfaces 702-1 and 702-2, in accordance with one embodiment of the present invention. As shown in FIG. 7, memory stack 700 includes one or more memory dies 741 that are bonded to a logic circuit die that includes memory controller 740. Through QV memory interface 704 between the bonded dies, memory controller 740 is connected to the QV memory arrays on memory dies 741. As shown in FIG. 7, RISC processor 701 accesses dedicated cache 708, which is connected to data buses 703R and 703W. Data bus 703R holds data read from the QV memory arrays and data bus 703W holds data to be written into QV memory arrays. Reading data from or writing data into a location in the QV memory arrays may be initiated, for example, by a suitable read or write command issued by a host CPU on memory bus 710, with the source or destination address of the location of the data to be read or written and, for a write command, the data to be written. For a read command, the data on data bus 703R is delivered to memory bus 710 at the end of the read cycle. Read/write interface 709 handles the protocols on memory bus 710 on behalf of memory controller 740. ECC correction circuit 705 corrects any error detected in data delivered from the QV memory arrays over QV memory interface 704. Check-bit generation circuit 706 provides check bits to accompany data to be written into the QV memory arrays over QV memory interface 704. DMA control circuit 707 provides control signals on QV memory interface 704 to perform the DMA operations described above with respect to FIG. 3. Refresh circuit 711 refreshes locations in the QV memory arrays within predetermined time intervals.

As shown in FIG. 7, memory controller 740 is also connected to an NVM system (e.g., a NAND-type non-volatile memory arrays) over NVM interfaces 702-1 and 702-2. Each of NVM interfaces 702-1 and 702-2 are connected to data buses 703R and 703W to access data read from the QV memory arrays or to provide data to be written into the QV memory arrays. DMA control circuit 707 also provides control signals to the NVM system over NVM interfaces 702-1 and 702-2 to perform DMA operations in the NVM system and between the NVM system and the QV memory arrays. Hence, NVM interfaces 702-1 and 702-2 provide a "back channel" (i.e., a non-CPU mediated additional memory access path) for connecting to other system hardware. Thus, memory controller 740 not only provides conventional memory operations in the QV memory, it also provides a back channel for other devices to access the QV memory. This arrangement allows the host CPU off-loads certain operations related to peripheral device to memory controller 740 to be performed on QV memory interface 704 and any back channel. (FIG. 7 shows two NVM interfaces merely to illustrate a high-performance system; a single NVM interface may suffice for a system requiring a lower performance.)

Memory controller 740 thus controls both a QV memory system and an NVM system. In fact, through NVM interfaces 702-1 and 702-2, memory controller 740 may control an array of NVM chips (e.g., flash memory chips). By implementing suitable software to run on RISC processor 701, memory controller 740 may also serve as a NVM-based storage controller or a solid-state disk (SSD) controller. This back channel in memory controller 740 provides an SSD attachment to the CPU, obviating a host bus adapter or a peripheral interface (e.g., a PCIe channel) that would otherwise be needed. The freed PCIe channel may be assigned to another use. In an SSD application, the back channel may be set up as an SSD controller for greatest performance and cost-saving gain. The back channel may also be set up as a controller for a JBOF ("just a bunch of flash"). In that configuration, memory controller 740 may be dynamically configured to serve any of a range of sizes of NVM memories, which may be varied by adding or removing NVM modules.

Figure 8A:
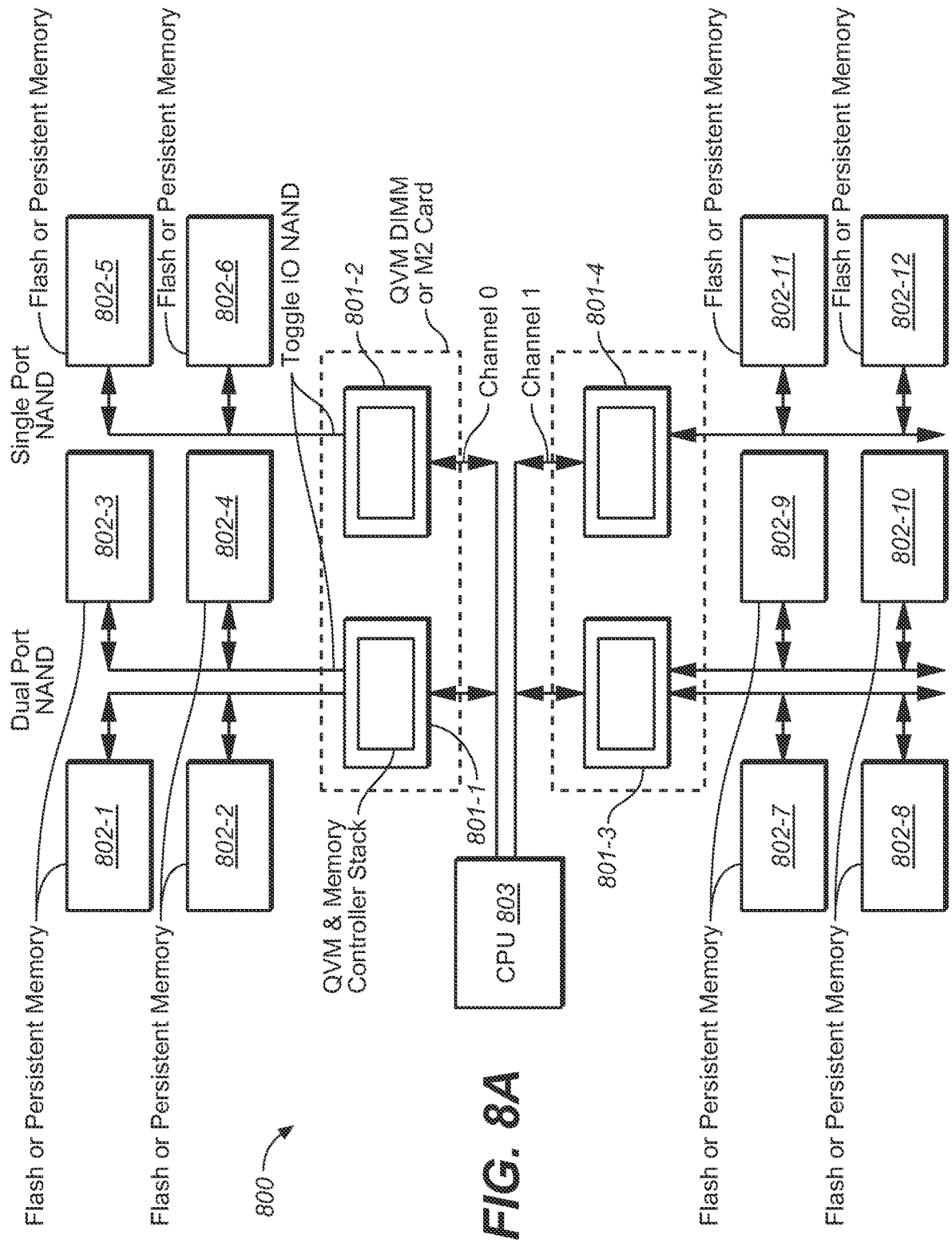
FIG. 8A shows exemplary system 800, in which memory stacks 801-1 to 801-4 each provide, in addition to access to a QV memory, a back channel to control NVM arrays in NVM banks 802-1 to 802-12, in accordance with one embodiment of the present invention.

FIG. 8A shows exemplary system 800, in which memory stacks 801-1 to 801-4 each provide, in addition to access to a QV memory, a back channel to control NVM arrays in NVM banks 802-1 to 802-12, in accordance with one embodiment of the present invention. As shown in FIG. 8, memory stacks 801-1 and 801-2, and NVM banks 802-1 to 802-6 are assigned to channel 0 of a QV memory bus accessed by CPU 803, while memory stacks 801-3 and 801-4, and NVM banks 802-7 to 802-12 are assigned to channel 1 of the QV memory bus. The NVM interfaces of memory stack 801-1 are each dedicated to a set of NVM banks (i.e., NVM banks 802-1 and 802-2, and NVM banks 802-3 and 802-4, respectively). Likewise, the NVM interfaces of memory stack 801-3 are dedicated to NVM chips 802-7 and 802-8, and NVM banks 802-9 and 802-10, respectively. Such a configuration allows two independent data streams to operate in the back channel simultaneously for high-performance. Alternatively, memory stack 801-2 and 801-4 each have their NVM interfaces share access to their respective NVM chips.

Figure 8B:
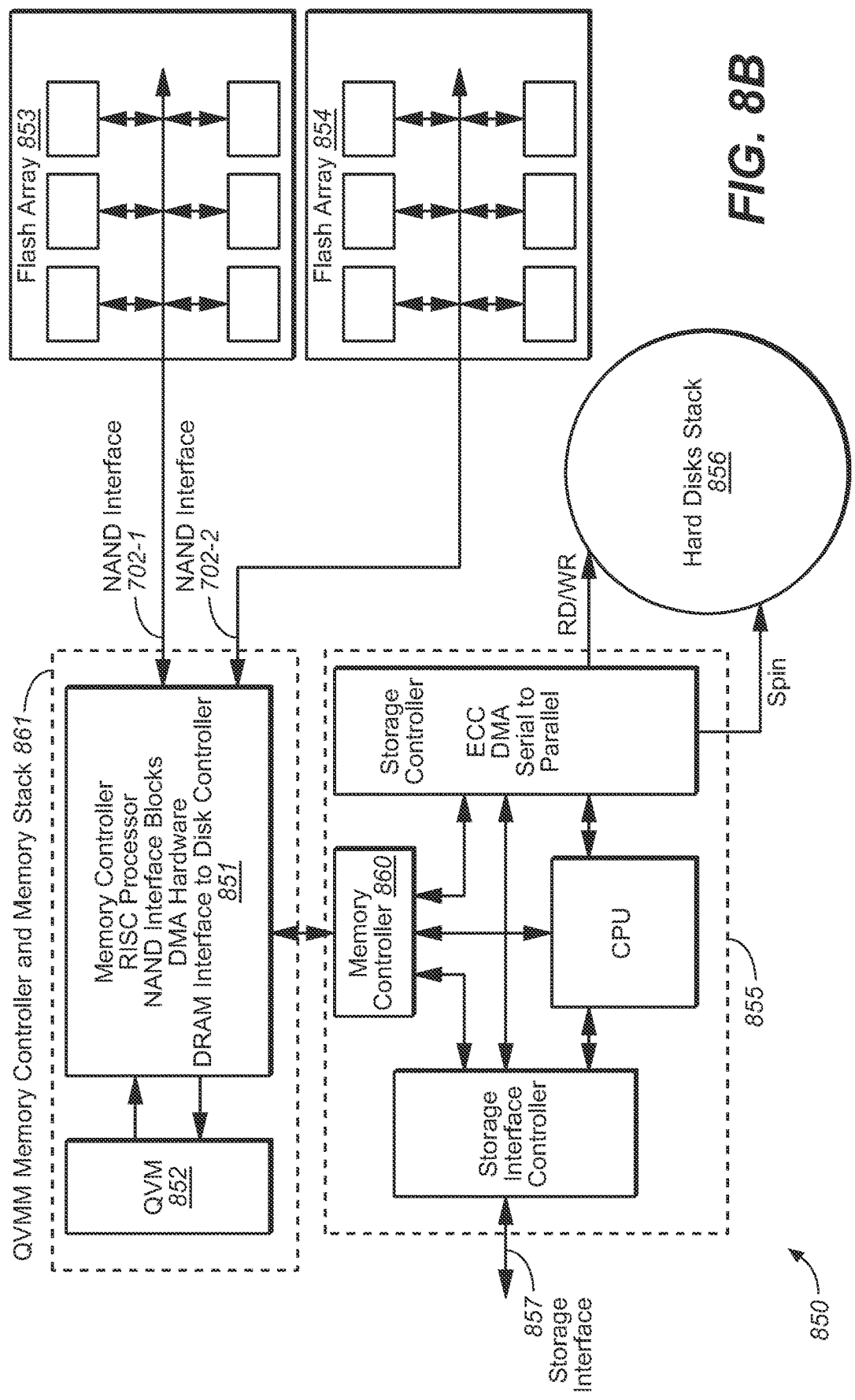
FIG. 8B shows exemplary disk system 850, in which memory controller 851 (in memory stack 861) provides an NVM controller in a back channel, in accordance with one embodiment of the present invention.

FIG. 8B shows exemplary disk system 850, in which memory controller 851 (in memory stack 861) provides an NVM controller in a back channel, in accordance with one embodiment of the present invention. As shown in FIG. 8B, disk system 850 includes conventional storage system controller 855 for accessing hard disk stack 856. Storage system controller 855—which receives storage commands over storage interface 857—accesses a QV memory in memory stack 861 over its memory controller interface 860. Memory controller 851 in memory stack 861—which services commands to memory stack 861—accesses QV memory 852 and provides a back channel to an NVM system using an NVM controller in memory stack 861, in the manner described above with respect to FIG. 7. Like memory controller 740 of FIG. 7, to provide the back channel, memory controller 851 of memory stack 861 includes NVM interfaces, which allow memory controller 851 to access and to control the NVM system. As shown in FIG. 8B, the NVM system include at least the NVM arrays in NVM banks 853 and 854.

In the examples of FIGS. 7, 8A and 8B, as the NVM systems are memory-mapped, accommodation in the operating system may be required to operate with the directory-and-file structure of a disk operating system. For example, a directory is provided in QV memory upon power-up to map the alphanumeric name of each process or file to a unique numeric identifier. The unique identifier may then be used with an address translation table—which is also loaded into QV memory upon power-up—to obtain the location of the process or file in the NVM system. The unique numeric identifier may be, for example, an index into the address translation table in QV memory. When an application is activated, the memory controller may obtain the location in the NVM system of the process or file from the address translation table using the unique numeric identifier. For efficient runtime use, the process or file may also be allocated a location in QV memory. Values of parameters of each process or file that may be required for operating system operations ("commands") may also be stored, for example, at known locations in QV memory. Using the NVM controller in the back channel, the process or file may be read from the NVM system into the allocated location in QV memory using a DMA control circuit (e.g., DMA control circuit 707 of FIG. 7). Each command from the host CPU to the memory controller uses the unique numeric identifier to specify an operation on the corresponding process or file in QV memory. In this manner, the commands may be executed in a very efficient manner without intervention by the host CPU.

Figure 10:
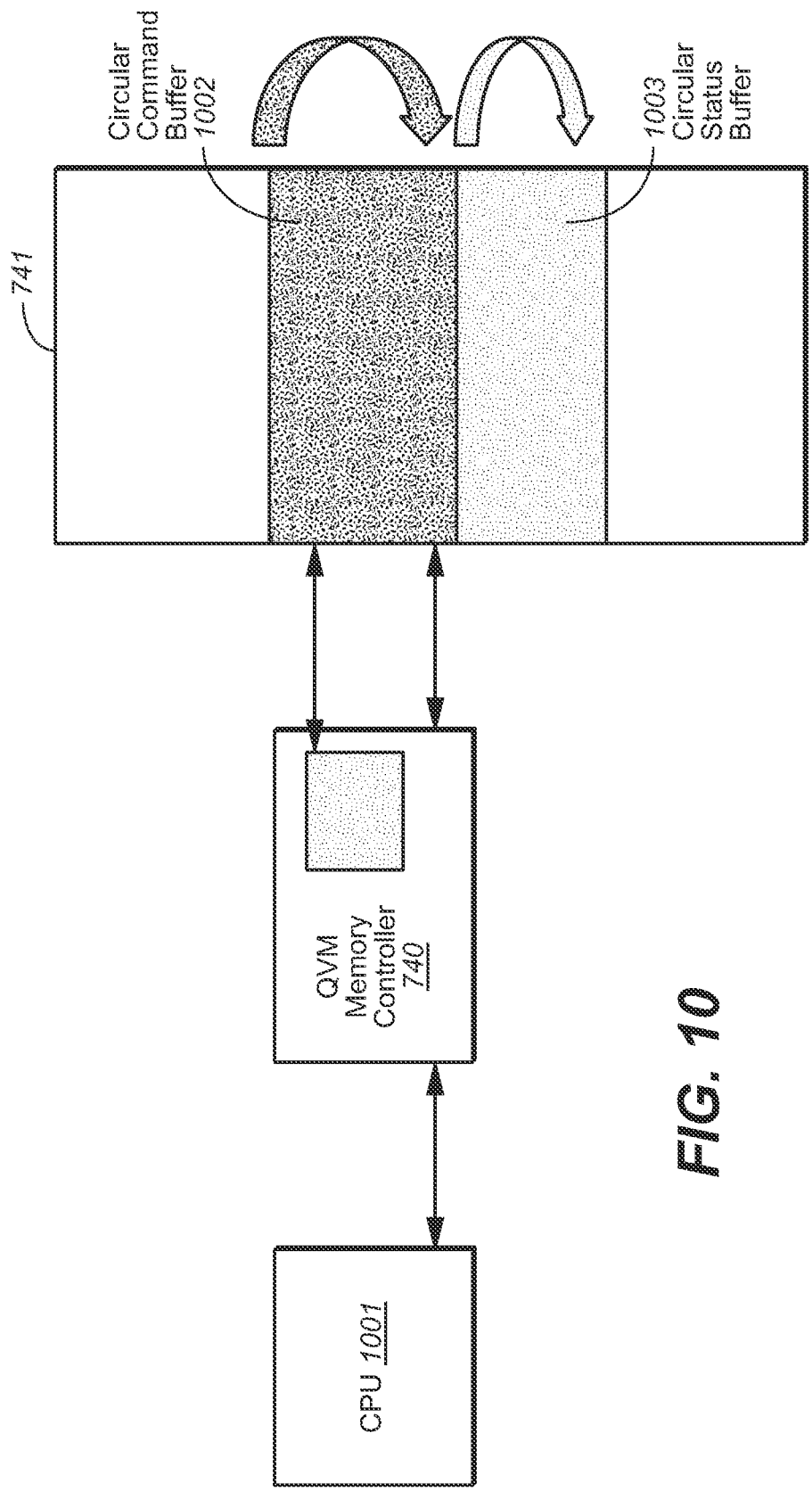
FIG. 10 illustrates sending commands from host CPU 1001 and tracking command execution in memory controller 740, in accordance with one embodiment of the present invention.

FIG. 10 illustrates sending commands from host CPU 1001 and tracking command execution in memory controller 740, in accordance with one embodiment of the present invention. As shown in FIG. 10, host CPU 1001 issues commands to "command buffer" 1002 and sets a corresponding entry in "status buffer" 1003, which is updated by memory controller 740 with status codes that indicate the progress of the command, as memory controller 740 carries it out. Multiple commands related to the same process or file may be issued and pending at the same time. When a command is issued, both its entry in command buffer 1002 and the corresponding entry in status buffer 1003 are marked "locked" (i.e., unavailable). These entries are released by host CPU 1001 after being notified by an interrupt from memory controller 740 that the command is complete. Memory controller 740 indicates completion of the command by an update to the corresponding entry in status buffer 1003. before issuing the interrupt to host CPU 1001. Host CPU 1001 takes appropriate action in response to the interrupt and releases for reuse the corresponding entries in both command buffer 1002 and status buffer 1003. These two buffers may be implemented as circular buffers.

In many conventional file systems, a translation table in memory points to memory blocks containing a file loaded into memory. The address translation table of the present invention may be used through commands to the memory controller, as described above, as efficiently as accesses to the translation table of a conventional file system. Additional efficiency in the translation function, including multi-tier translations, may be achieved using content-addressable memory techniques, which may be implemented quite readily in the QV memory.

Therefore, the data transfer operations of the present invention, as described above with respect to FIGS. 8A and 8B, for example, not only avoid contention in the host CPU, but also eliminate the slow hardware stack associated with a traditional disk-type access. For example, the parsing of a FAT tree, the breaking up of a command involving a large NVM logical segment into separate commands for accessing NVM physical segments, and the input/output handshake operations often seen in many disk interfaces are all eliminated. Thus, software overhead associated with data transfer in the back channel is greatly reduced relative to the overhead for such a data transfer in a conventional disk-type hardware, resulting in reduction of many microseconds in latency.

Figure 9:
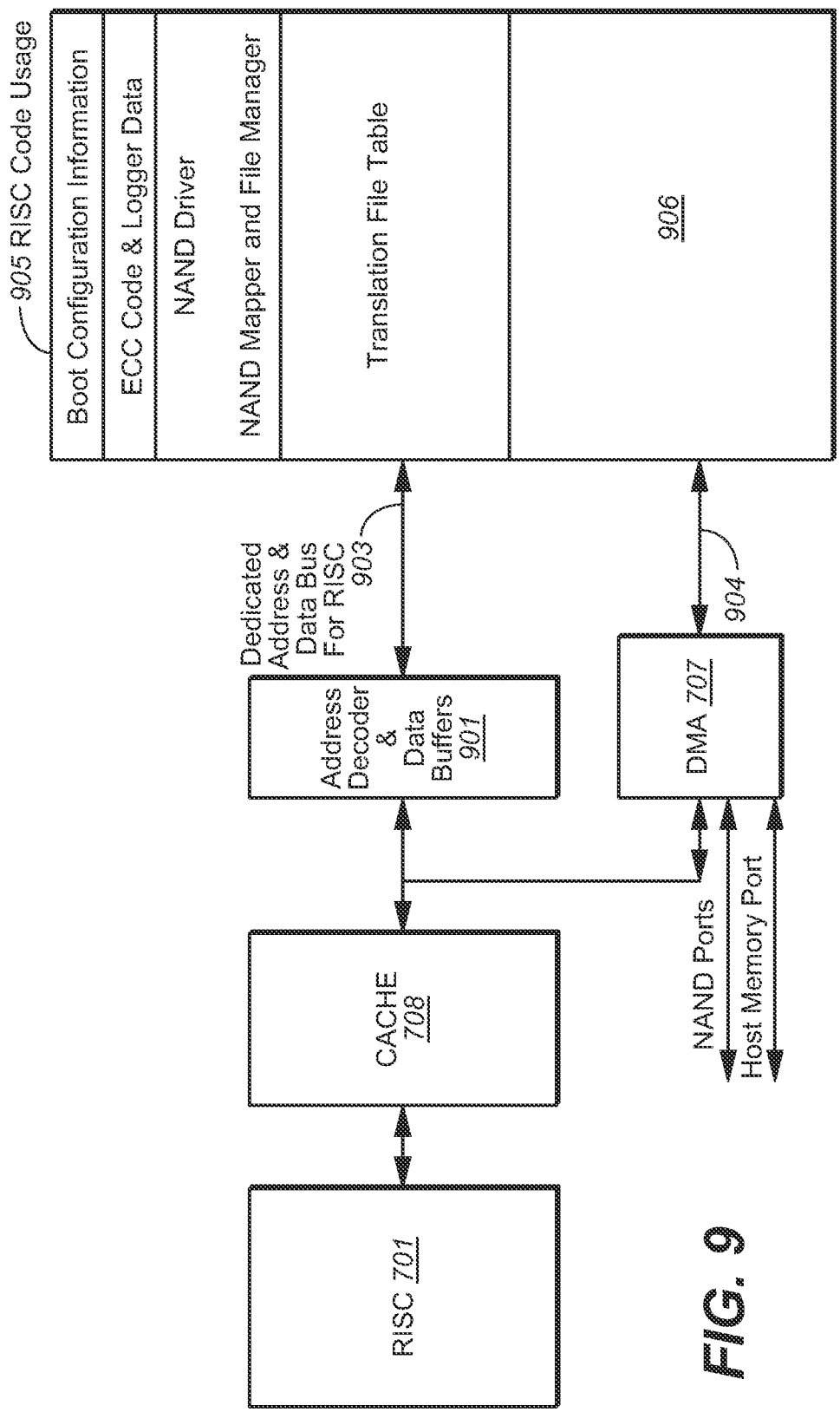
FIG. 9 illustrates exemplary implementation 900 of program codes and data in QV memory for RISC processor 701, in accordance with one embodiment of the present invention.

FIG. 9 illustrates exemplary implementation 900 of program codes and data in QV memory for RISC processor 701, in accordance with one embodiment of the present invention. As shown in FIG. 9, the QV memory consists of portions 905 and 906. RISC processor 701 and cache 708 (first discussed above with respect to FIG. 7) access the QV memory through address decoder and data buffer circuit 901. Accesses involving QV memory portion 905—storing privileged program codes and program data, as explained below—by RISC processor 701 are carried out on dedicated bus 803. All other accesses to QV memory (i.e., QV memory portion 906), including DMA operations, are carried out on memory bus 904. The boot code for loading the software for memory controller 740 into QV memory, for example, resides in an NVM or an OTP memory (not shown) in memory controller 740. As part of the boot sequence, the program codes and program data are read into QV memory from the NVM. The software includes a predetermined memory location ("entry point") in QV memory, from which RISC processor 701 begins execution of memory controller 740. To protect the program codes and program data in portion 905, two bounds registers are set to define the range of addresses delimiting portion 905 ("window 905") in QV memory, thereby isolating window 905 from any other user or system processes. Only a process with the requisite privileges running on memory controller 740 may access window 905. In this manner, system performance is improved by obviating any arbitration hardware that would otherwise be required to arbitrate accesses to window 905. Any attempted unauthorized access to window 905 is trapped by address decoder and data buffer circuit 901, which raises a flag to indicate that a system fault state has occurred.

FIG. 9 provides as examples the following program codes and program data that may be stored in window 905: (a) boot configuration information; (b) ECC codes and error logger data; (c) NVM controller, driver, mapper or file manager; and (d) address translation table. As explained above, the address translation table maps the unique numeric identifier to the location in QV memory system where the corresponding process or file resides. This address translation table grows over time as the number of stored files increases. In some embodiments, a reduced table may be provided in which only active files are maintained in QV memory. Access to a file not in the reduced table results in a search by the memory controller software executing in RISC processor 701 to the full address translation table stored in the NVM system through the back channel. Once found in the full address translation table, the missed file is entered into the reduced table.

In the examples of FIGS. 7 and 8A, where two NVM interfaces (i.e., NVM interfaces 702-1 and 702-2) are provided in each memory stack, a file may be distributed by a memory controller of a memory stack between its two NVM banks (i.e., memory controller 801 may distribute a file between NVM banks 802-1 and 802-2). In that instance, the memory controller in a memory stack handles all accesses to the NVM banks for a file that is assigned to its portion of the QV memory space. Data buffers may be provided under control of its DMA control circuit (e.g., DMA control circuit 707 of memory controller 740) for data movement between the portion of QV memory it controls and the portion of NVM it controls. In some embodiments, when the QV memory arrays of the memory stacks together form a QV memory system, and the NVM arrays associated with the back channels of the memory controllers together form an NVM system, each memory controller handles accesses to its QV memory and NVM arrays independently. In this manner, multiple accesses to the QV memory or NVM system may occur simultaneously, resulting in a very high system throughput. Alternatively, a system may be constructed to have the memory controllers of the multiple memory stacks operate on "islands of QV memory" together with "islands of NVM." In such a system, which allows fast, simultaneous accesses, special "cross-island" handling protocols are required for data movements between two QV memory islands, between two NVM islands and a QV memory island and an NVM island across memory stacks.

Data stored in a system of the present invention may be encrypted for security reasons (e.g., corporate bank transactions, customer lists or confidential technical information). Encryption of a file is conventionally performed by the host CPU prior to committing the file to a persistent memory or an NVM storage. Decryption is typically performed in the opposite data movement direction. Thus, encryption and decryption are computationally intensive burdens on the host CPU, leading to some systems delegating the encryption and decryption tasks to accelerator boards. (Such an accelerator board retrieves the file to be encrypted into memory, performs the encryption, and writes the encrypted file to persistent storage of a disk; decryption is carried out in the opposite data movement direction.) With a back channel of the present invention, encryption and decryption may be achieved in the memory controller by, for example, the RISC processor (e.g., RISC processor 701), without intervention by the host CPU and without file transfers as the data is already resident. In some embodiments, additional logic circuits may be provided to assist. Under the present invention, neither a computational burden imposed on the host CPU nor an acceleration board is required, resulting in significant cost-savings and higher performance. System 800 of FIG. 8A readily allows encrypting and storing a file in an NVM according to the present invention, for example. Likewise, system 850 of FIG. 8B readily allows encrypting and storing a file to a disk drive according to the present invention. Additional commands related to encryption and decryption may be provided. For example, an "Encrypt and Report" command may result in encrypting a file and leaving the encrypted file in QV memory. (The encrypted file may be subsequently retrieved from QV memory and be sent to an external storage device.) As another example, an "Encrypt and Store" command result in the memory controller performing both file encryption and storage in NVM.

Data compression and decompression may be supported by data compression circuitry and data decompression circuitry in like manner.

The present invention also offers off-loading of other functions conventionally handled by the host CPU to the memory controller. For example, to ensure data integrity in database management systems, it is required that a transaction (e.g., a task or calculation) is complete or not take place at all (i.e., an "atomic operation"). Without such a requirement, data corruption may result when an error condition occurs in mid-transaction (e.g., a loss of power). To achieve the atomic operation, the database software creates checkpoints, which constitute a running record of the states of the transaction, each recorded at a checkpoint. The state of the transaction at each checkpoint is represented by a set of key parameter values, which represent information to allow the transaction to be backed out to the immediately previous checkpoint, should an error condition occur. The checkpoint records are typically written out to a log file in a persistent storage system. Often, the log file is implemented as a circular file, i.e., each checkpoint record is written in the space following the last checkpoint record and, when the end of the log file is reached, the next checkpoint record overwrites the checkpoint record at the beginning of the file. In the prior art, whether the log file is maintained on a magnetic or solid-state disk, or persistent memory, the host CPU typically generates the log file and issues a disk command that require the host CPU to execute disk stack software. A host CPU in a method of the present invention, however, merely prepares the data and parameter values in QV memory and then issues a command to the memory controller to store the checkpoint file using, for example, the mechanism discussed above with respect to FIG. 10.

Another example of an application of the present invention is "journaling." When an operation of the system is disrupted by a power outage or a similar major event, the operating system may recover by repeating, from a previously saved checkpoint, operations that are recorded in a journal up to the point of failure. Like the database checkpoint operations described above, journaling may rely on keeping track of operations in a circular buffer that is written into NVM, persistent memory, or a system disk file. According to one embodiment of the present invention, a portion of the journal file is written into QV memory, which is then committed to NVM by the memory controller using a back channel. In one embodiment, the journal file is automatically saved into NVM using the back channel every time the journal file in QV memory is updated. Such a scheme saves processor overhead associated with disk stack operation, as host CPU intervention is not required.

In the above description, the memory controller for QV memory also controls the NVM system. If the NVM memory is implemented by flash memory, the large erase blocks result in a slow erase operation. To improve write operation performance, the flash memory arrays may be virtualized (i.e., the physical address space for the NVM is managed by a flash memory controller with assistance by the QV memory controller). If persistent memory is used, a fast erase operation may be carried out for fewer memory cells than a block; in such an erase operation, a direct mapping of physical locations visible to the QV memory controller or even visible to the host CPU may be used.

Figure 11:
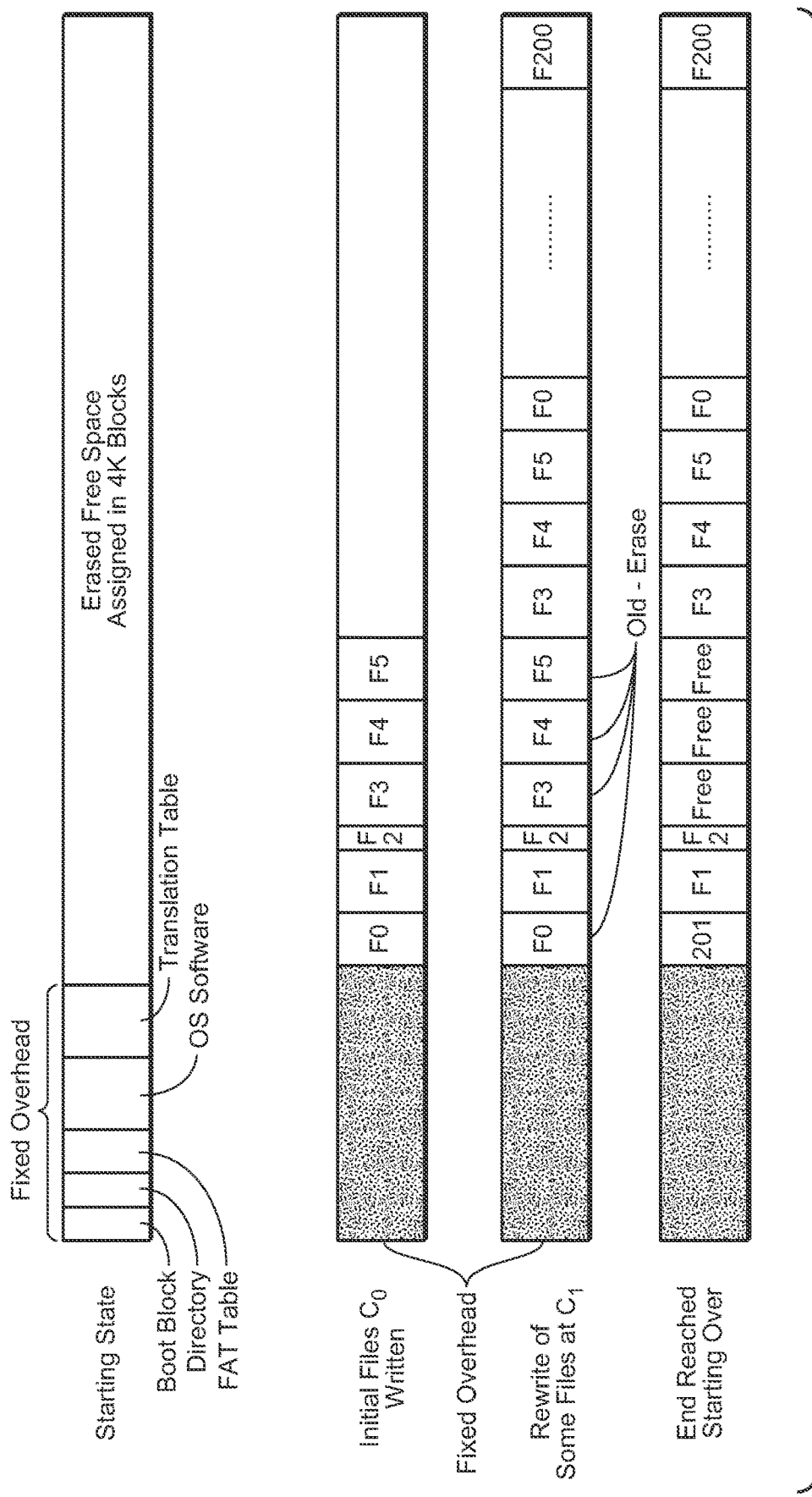
FIG. 11 illustrates one implementation of virtualizing a QV memory, in accordance with the present invention.

FIG. 11 illustrates one implementation of virtualizing an NVM, in accordance with the present invention. The NVM is allocated in block increments, with each block consisting of 4K bytes of NVM cells. Initially, the NVM is completely erased, except for overhead files, which are expected to change only very infrequently. Such files, for example, include the boot block, the directory, a FAT table, operation system software and the address translation file. The remainder of the NVM are erased cells. The first file ("F0" in FIG. 11) is stored in the first available location appended to the section of the NVM following the overhead files. The file name of F0 and its location in NVM is recorded in the address translation tables in both the NVM and the QV memory. Subsequent files (e.g., files F1-F5 in FIG. 11) are written one after the other, as shown for time to in FIG. 11, with their locations provided in the address translation tables in both the QV memory and the NVM. When a file is written into NVM, the entire file is written in the next available erased space in NVM. The new location is updated in the address translation tables of both the QV memory and the NVM, with the NVM locations occupied by the old file are marked to be reclaimed. FIG. 11 shows that, at time 11, that files F3, F4, F5 and F0 have been updated in order in NVM, and subsequent files, up to files F200 are written in the erased space of the NVM. During this time, or when necessary, the NVM cells marked for reclamation are erased using block erase. FIG. 11 shows, at time $t_1$, the locations in NVM of the now obsolete files F0, F3, F4 and F5 have been erased and, specifically, the location of F0 has been reused by file F201, written after file F200. Note that the non-overhead portion of the NVM is used in the manner of a circular buffer. In this manner, the NVM cells are rotated to avoid any one location from being used more than another, thereby increasing endurance performance. NVM files that are updated infrequently ("cold files") may be stored in an area of NVM that can easily be skipped over.

The memory controller may keep track of the revision activities of each file in a control file. Cold files may be grouped with other cold files, and the entire group may be skipped over easily. (If a cold file becomes active, it is removed from the group at the time of the address update). In some embodiments, the file types may be used to assist in assigning storage locations. For example, pictures or video file types may be grouped together and treated as cold files, as they are rarely updated. In this manner, overall management is simplified.

Thus, as each file location changes in the NVM, the address translation tables in both the QV memory and NVM are adjusted. The frequency of updating the address translation tables does not become too high, as the address information changes only when file locations change. Most files are updated often when first created but updates quickly become infrequent. To accommodate this behavior, the address translation tables in QV memory and NVM are not rewritten on each update, except when a new file is added. Instead, the system uses an update table to record each such update and adjusts the information from the address translation table in QV memory using the update table to construct the current NVM location of the file. From time to time, the address translation tables in QV memory and NVM are updated to integrate the accumulated updates in the update table into the address translation tables.

Figure 12:
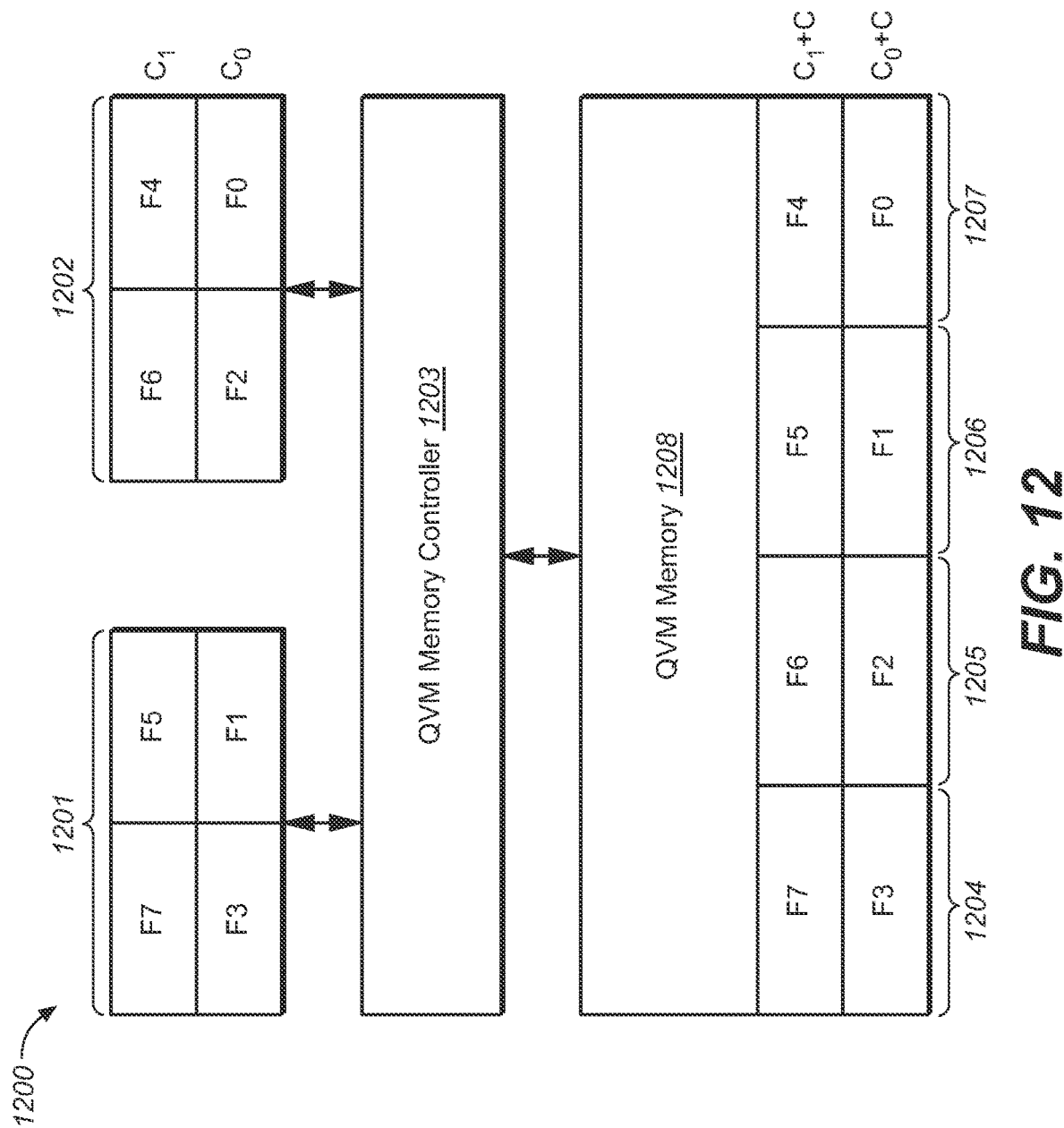
FIG. 12 illustrates memory controller 1203 having dual-write ports 1201 and 1202 to receive data simultaneously into QV memory 1208, in accordance with one embodiment of the present invention.

FIG. 12 illustrates memory controller 1203 having dual-write ports 1201 and 1202 to receive data simultaneously into QV memory 1208, in accordance with one embodiment of the present invention. As shown in FIG. 12, QV memory 1208 includes two banks each having 2 columns of blocks. Specifically, in FIG. 12, blocks 1204 and 1205 are blocks in a row of bank 0 and blocks 1206 and 1207 are blocks in the same row of bank 1. As shown in FIG. 12, ports 1201 and 1202 are each 2-block wide. The two blocks received at port 1201 are to be respectively written into banks 0 and 1, respectively. Likewise, the two blocks received at port 1202 are also to be written into banks 0 and 1, respectively. In FIG. 12, within time period to, data blocks labeled F2 and F0 and data blocks labeled F3 and F1 arrive at ports 1201 and 1202 of QV memory controller 1203. Within a predetermined latency τ, data blocks F3 and F2 are written by one set of drivers into bank 0 and, independently, data blocks F1 and F0 are written by a second set of drivers into bank 1. Likewise, within time period time $t_1$, data blocks F7 and F5 arrive at port 12-1 and data blocks F6 and F4 arrive at port 1202. After the predetermined latency τ, data blocks F7 and F6 are written into bank 0 by the first set of drivers and data blocks F5 and F4 are written into bank 1 by the second set of drivers independently.

If the interfaces in the back channel (e.g., NVM interfaces 702-1 and 702-2) are interfaces to peripheral devices (e.g., a PCIe interface), the back channel allows the memory controller to connect to devices that access data in memory. One example of such a device is an external storage system running the NVMe protocol known to those of ordinary skill in the art. By connecting such a device to the back channel, memory access by the device can be accomplished without a host bus adapter or through DMA mediated by the host CPU. As the back channel has access to the memory arrays of the QV memory, ample data buffers are available to accommodate the difference in speed between a QV memory access and the data rate of the device. In this manner, the back channel can interface the QV memory with any SATA, SAS, SCSI Fiber Channel or ethernet device or devices, thereby avoiding the overheads of conventional CPU hardware and software.

Figure 13:
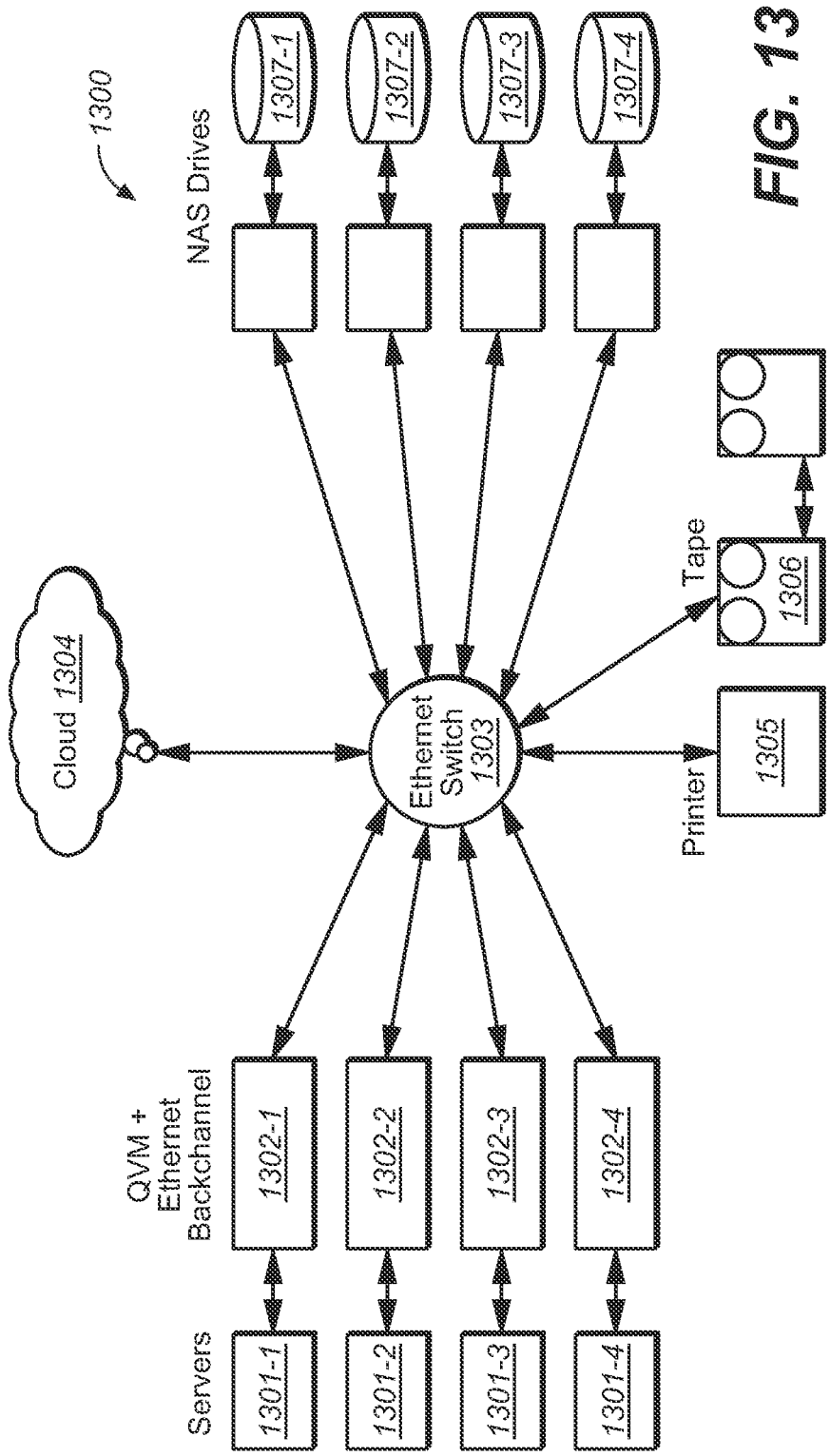
FIG. 13 illustrates computer network 1300, which includes host processors (e.g., servers) 1301-1 to 1301-4 having ethernet-based back channels to connect to storage and other devices, in accordance with one embodiment of the present invention.

FIG. 13 illustrates computer network 1300, which includes host processors (e.g., servers) 1301-1 to 1301-4 having ethernet-based back channels to connect to storage and other devices, in accordance with one embodiment of the present invention. As shown in FIG. 13, host processors 1301-1 to 1301-4 access their QV memories and back channels through memory controllers 1302-1 to 1302-4, respectively. In this embodiment, each back channel includes an ethernet interface that allows its associated host processor access to other devices and host processors of computer network 1300 through ethernet switch 1303. FIG. 13 shows, in addition to host processors 1301-1 to 1301-4, the other devices connected to ethernet switch 1303 include printer 135, tape storage device 1306 and network attached storage devices 1307-1 to 1307-4. Under this configuration, host processors 1301-1 to 1301-4 may use their back channels to exchange data in their QV memories with each other. Ethernet switch 1303 is also shown in FIG. 13 to be connected to "cloud" 1304, which may represent a wide area network (e.g., the internet), essentially providing network access to unlimited resources. The present invention may also provide a back channel based on a USB-type interface.

Having a network interface in the back channel is particularly significant. The network interface provides a direct data path for data transfer between the QV memory of any server in the network to any device on the network. For example, an enterprise server may load all outbound data traffic of its internal network into its memory for direct transfer to one or more recipients on the internet. Such an arrangement improves efficiency by its simplified process and by obviating a spooler. The direct memory-to-memory data made possible by the present invention greatly reduces latencies in very large data transfers over the network, as data may be retrieved out of QV memory much quicker than retrieval out of NVM storage. In this manner, large amounts of data (e.g., movies, popular websites with video contents) may be served or streamed to many recipients over the network from the QV memory of a server.

Another application for a back channel with a network interface is to provide system backup services. A memory-to-storage system or a memory-to-network back channel allows the QV memory controller to schedule back-up operations for the associated host CPU or server. A remote storage system is preferred. In one embodiment, a back-up is initiated for a database, whenever it is saved. When data of a process is saved to a local storage device (e.g., an NVM) to allow the server to service another process, the data can also be simultaneously stored as a second copy in a remote, off-site storage device for disaster recovery. Thus, under the present invention, the memory controller serves both as a backup path and a recovery path. As the QV memory is directly connected to the storage devices, the storage and backup operations occur in real time for maximum recovery coverage, i.e., an assurance that critical files are backed-up without delay.

Figure 14:
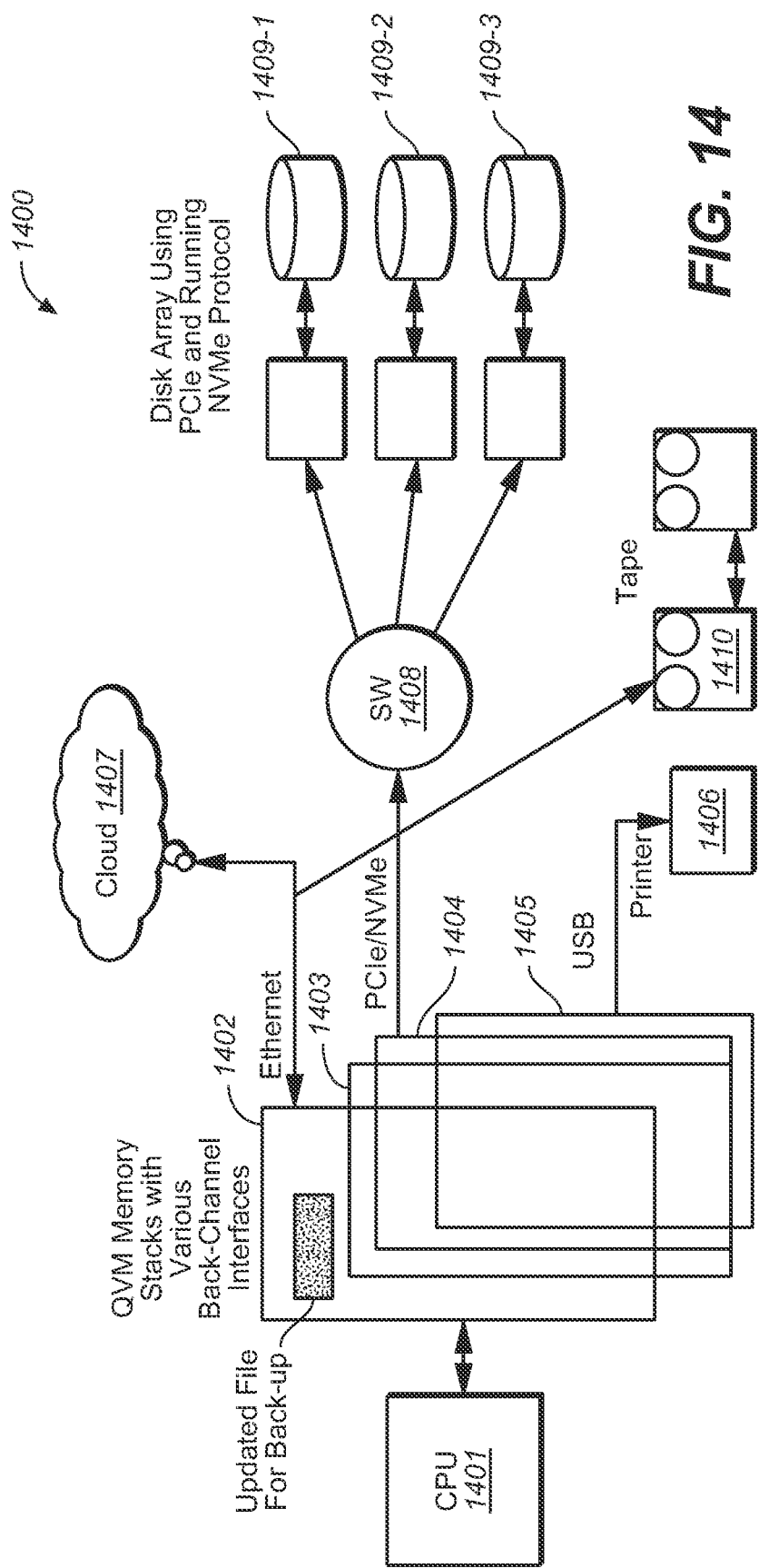
FIG. 14 illustrates in computer system 1400 real time back-up operations for saving copies of a file both in NVM and remotely at a site over a network, in accordance with one embodiment of the present invention.

FIG. 14 illustrates in computer system 1400 real time back-up operations for saving copies of a file both in NVM and remotely at a site over a network, in accordance with one embodiment of the present invention. As shown in FIG. 14, host CPU 1401 communicates with memory controllers 1402-1405 of 4 memory stacks, with each memory controller managing a QV memory and an interface to a back channel. Specifically, memory controller 1402 has an ethernet-based back channel interface to connect to "cloud" 1207—which may be any computer network (e.g., the internet)—and local tape device 1410. Likewise, memory controller 1204 has a PCIe interface or an NVM interface to connect to multiple storage devices 1409-1 to 1409-3 through switch 1408 and memory controller 1405 has a USB-type interface that connects to printer 1406. In the system of FIG. 14, an updated file in QV memory may be backed-up by memory controller 1402 in real time to local tape device 1410 and simultaneously to a remote storage through cloud 1207, according to the present invention.

The present invention also mitigates the "memory bottleneck" problem often seen in graphics and artificial intelligence (AI) applications that use a graphics processor (GPU) to perform computationally intensive calculations. In a conventional system, both the CPU and the GPU are provided dedicated DRAM-based memories for their operations. Typically, in many graphics and AI applications, data is first fetched from a storage device (e.g., a disk storage device) into CPU memory, from which the CPU then causes the data to be copied over, for example, a PCIe interface to the GPU memory for GPU operations. The memory bottleneck problem relates to having the GPU wait in idle states when data is loaded into the GPU memory. As the QV memory has a higher data density than conventional DRAM-based memory, significantly more data can be stored in QV memory than in conventional DRAM, and thus the memory bottle-neck problem is generally less severe in a QV memory system. Even then, both the CPU and the GPU are involved in seeing to the data transfer between their memories by DMA. Also, after the data is loaded into GPU memory, the conventional CPU has to issue a command over the PCIe bus to communicate requested GPU operations.

Figure 15:
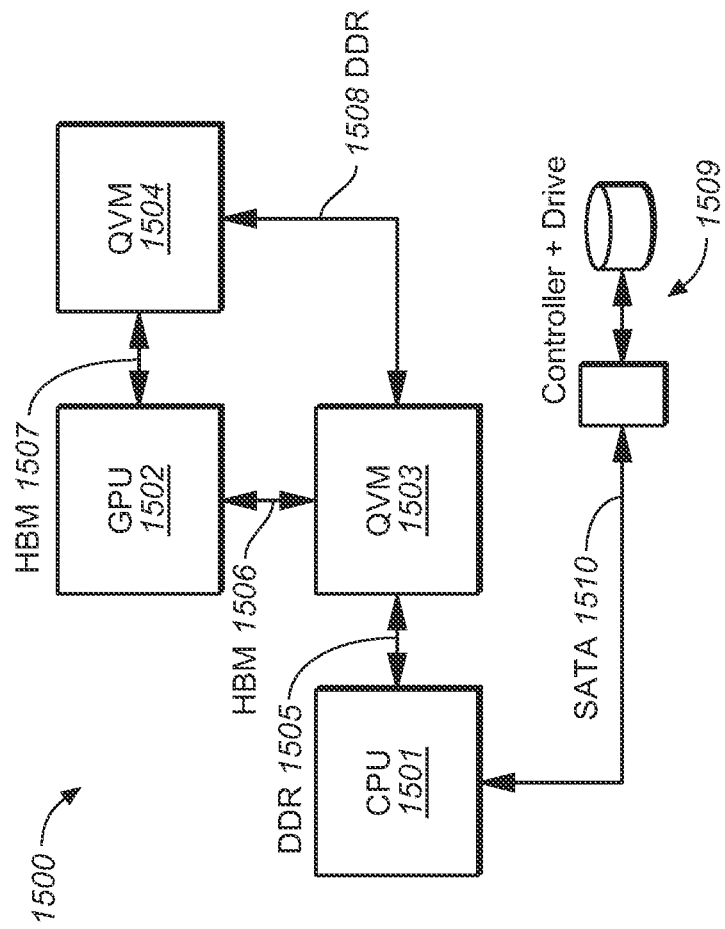
FIG. 15 shows exemplary computer system 1500, including CPU 1501 and GPU 1503, which access QV memories ("CPU QV memory" and "GPU QV memory") managed by memory controllers 1503 and 1504, respectively, in accordance with one embodiment of the present invention.

According to one embodiment of the present invention, improved performance is achieved by sharing the QV memories between the CPU and the GPU and by providing in a back channel an additional memory bus (e.g., a high bandwidth memory (HBM) bus). FIG. 15 shows exemplary computer system 1500, including CPU 1501 and GPU 1503, which access QV memories ("CPU QV memory" and "GPU QV memory") managed by memory controllers 1503 and 1504, respectively, in accordance with one embodiment of the present invention. CPU QV memory and GPU QV memory and their respective memory controllers 1503 and 1504 may be provided in two QV memory-type memory stacks, respectively. As shown in FIG. 15, memory controller 1503 allows the CPU QV memory to be accessed by CPU 1501 over industry standard bus interface ("DDR bus interface"; e.g., conforming to any of DDR3, DDR4, DDR5 industry standards) 1503 and provides a back channel over HBM bus interface 1506, which may be accessed by GPU 1502. Memory controller 1504 allows the GPU QV memory to be accessed by GPU 1502 over HBM bus 1507 and provides a back channel over DDR bus interface 1508. In computer system 1500 of FIG. 15, memory controllers 1503 and 1504 may each handle direct memory-to-memory transfers between the CPU QV memory and the GPU QV memory over HBM interface 1506 and DDR bus interface 1508, respectively, using their respective DMA control circuits. In one embodiment, the CPU QV memory and the GPU QV memory are different portions of an integrated QV memory. In that case, memory controller 1503 manages the integrated QV memory and memory controller 1504 need simply provide circuits for memory interfaces 1507 and 1508.

In computer system 1500, each QV memory may be multi-ported and may be divided into multiple blocks, such that one port may be loading data into a memory block, while another port retrieves data from a previously loaded memory block. In this system, a simple protocol based on a special register or registers assures exclusive access of a memory block without requiring complex lockout hardware. For example, after loading data into the CPU QV memory from storage system 1509 using a SATA interface in a back channel, CPU 1501 may cause memory controller 1503 to initiate a block of data in the CPU QV memory to be transferred to a specific memory block (say, GPU block 0) in the GPU QV memory over HBM 1506. Upon completion of the data transfer, memory controller 1503 sets a bit in the GPU special register to signal that GPU block 0 is loaded with valid data. Thereafter, GPU 1502 may operate on the data in GPU block 0. When GPU 1502's operations are complete, GPU 1502 initiate a memory-to-memory transfer from GPU block 0 over DDR bus 1508 to a designated result memory block in the CPU QV memory and sets a bit in a CPU special register to indicate that the results are ready for access by the CPU and clears the bit in the GPU register to indicate that GPU block 0 is available for reuse. In the meantime, while GPU 1502 operates on the data in GPU block 0, CPU 1501 may initiate data transfer to another block (say, GPU block 1) in the GPU QV memory.

Figure 16:
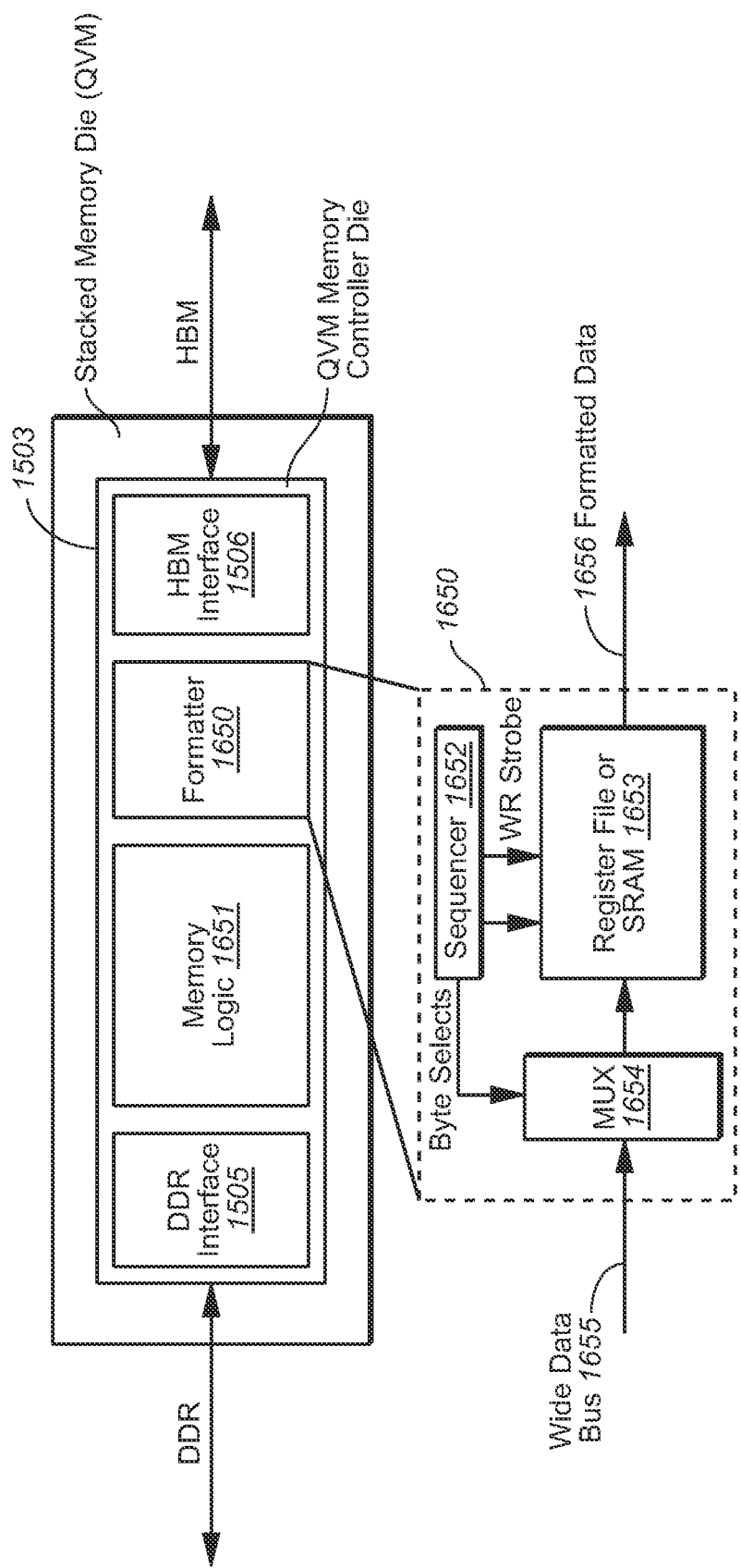
FIG. 16 shows formatter 1650 in memory controller 1503 of FIG. 15, in accordance with one embodiment of the present invention.

If the data in the GPU QV memory are required to be in a specific format, memory controller 1503 may provide a formatter circuit to perform the formatting function prior to writing the formatted data into the GPU QV memory over HBM 1506. Such a circuit obviates the formatting that GPU 1502 would otherwise have to expend valuable cycles to perform. FIG. 16 shows formatter 1650 in memory controller 1503 of FIG. 15, in accordance with one embodiment of the present invention. As shown in FIG. 16, in addition to the memory control circuit 1651 (e.g., those of memory controller 740 of FIG. 7), memory controller 1503 further includes formatter circuit 1650. In this example, formatter circuit 1650 rearranges the data bytes on internal bus 1655 (e.g., from little-endian format to big-endian format). Thus, formatter circuit 1650 includes multiplexer 1654 which selects from internal bus 1655 a formatting unit of data (e.g., a byte) according to sequencer 1562. The selected data output from multiplexer 1654 is formatted and written in register file 1653. When all data on internal bus 1655 are processed, sequencer 1652 enables register file 1653 to output the formatted data to output bus 1656, which is then received into HBM interface 1506. An alternative data path (not shown) may be provided to bypass formatted circuit 1650, when a control bit is set. In that event, the data on internal bus 1655 is directly provided to HBM interface 1506. Typically, formatting is performed on data to be loaded into the GPU QV memory. However, formatting may be provided in substantially the same manner for data coming from the GPU QV memory to be loaded into the CPU QV memory.

Formatter circuit 1650 may be built, for example, from field programmable gate arrays (FPGAs), as known to those of ordinary skill in the art, to take advantage of the highly flexible FPGA programmability. FPGAs allow the user to tune the formatting function and to match their algorithm for operating on a specific data set. The FPGA configuration can be stored and recovered from an internal NVM of memory controller 1503. Alternatively, as a QV memory is also capable of serving as an NVM under an NVM mode of operation, one portion of the QV memory may be set aside for operating under NVM mode. (In most QV memories, a portion of the QV memory is already set aside to operate under NVM mode for "house-keeping" purposes, such as a defective-block directory.) FPGAs provide efficient building blocks for forming many common circuitry (e.g., combinational logic, registers, shifters and state machines).

Figure 17A:
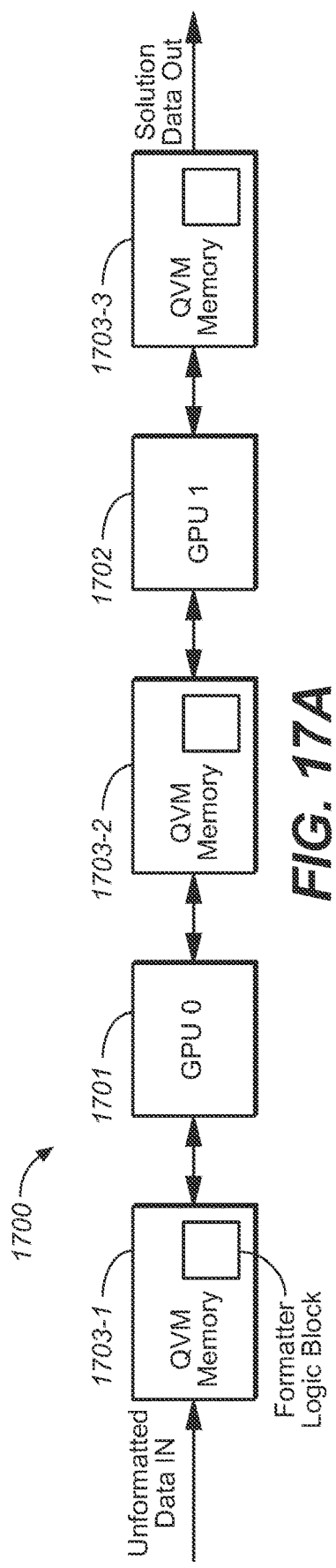
FIG. 17A shows computer system 1700, in which data flows through stages of a pipeline of QV memory stacks 1703-1 to 1703-3, which are processed in sequence by cascaded GPUs 1701 and 1702, in accordance of an embodiment of the present invention.

For some applications, multiple GPUs are required (e.g., complex neural networks in AI applications). FIG. 17A shows computer system 1700, in which data flows through stages of a pipeline of QV memory stacks 1703-1 to 1703-3, which are processed in sequence by cascaded GPUs 1701 and 1702, in accordance of an embodiment of the present invention. Computer 1700 may be used as a configuration that replaces, for example, the memory stacks of the CPU QV memory and the GPU QV memory and GPU 1502 in computer system 1500 of FIG. 15. In essence, computer system 1700 adds additional GPU 1702 to the configuration of computer system 1500.

Figure 17B:
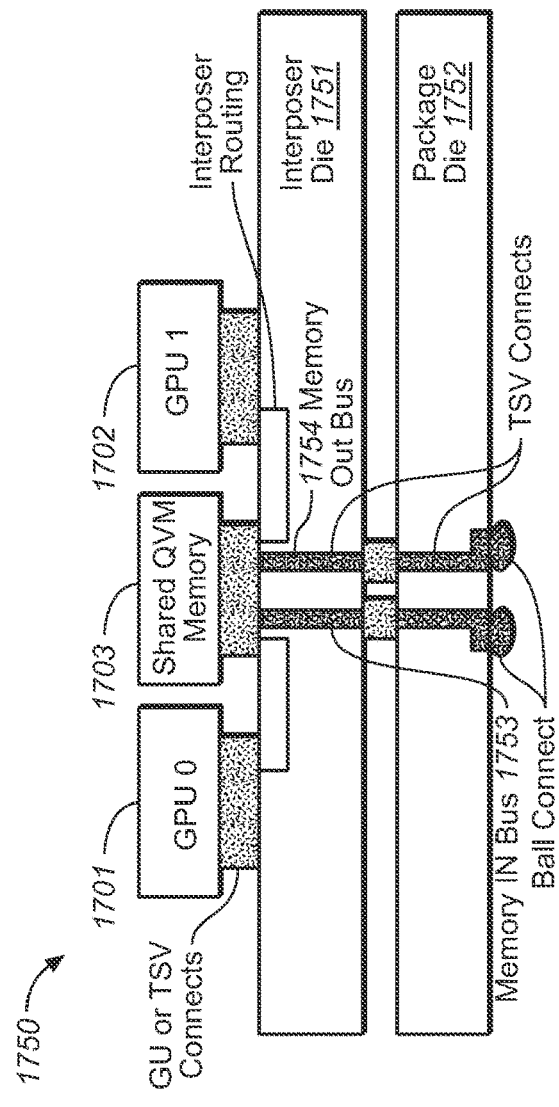
FIG. 17B shows implementation 1750 for computer system 1700 using interposer die 1751 for interconnection of components, in accordance with one embodiment of the present invention.

FIG. 17B shows implementation 1750 for computer system 1700 using interposer die 1751 for interconnection of components, in accordance with one embodiment of the present invention. As shown in FIG. 17B, QV memory stacks 1703-1 to 1703-3 are integrated into single, shared QV memory stack 1703. GPUs 1701 and 1702, and QV memory stack 1703 are interconnected with each other through interposer die 1751 and the QV memory interfaces (i.e., the copper studs and the TSVs of GPU 1701, GPU 1702 and integrated memory stack 1703). Interposer die 1751 is mounted on package substrate 1752. Package substrate 1752 may be a part of a ball grid array package that provides solder balls on one surface of the package for connecting to its internal components. In FIG. 17B, TSVs are provided through interposer die 1751, so that the through vias in package substrate 1752 facilitate the external connections to the components mounted on interposer die 1751. For example, as shown in FIG. 17B, read and write memory buses 1753 and 1754 are not only accessible by GPUs 1701 and 1702 through their QV memory interfaces and interposer die 1751, read and write memory buses 1753 and 1754 are also accessible from solder balls on the outside of the package that includes package substrate 1752.

Figure 18:
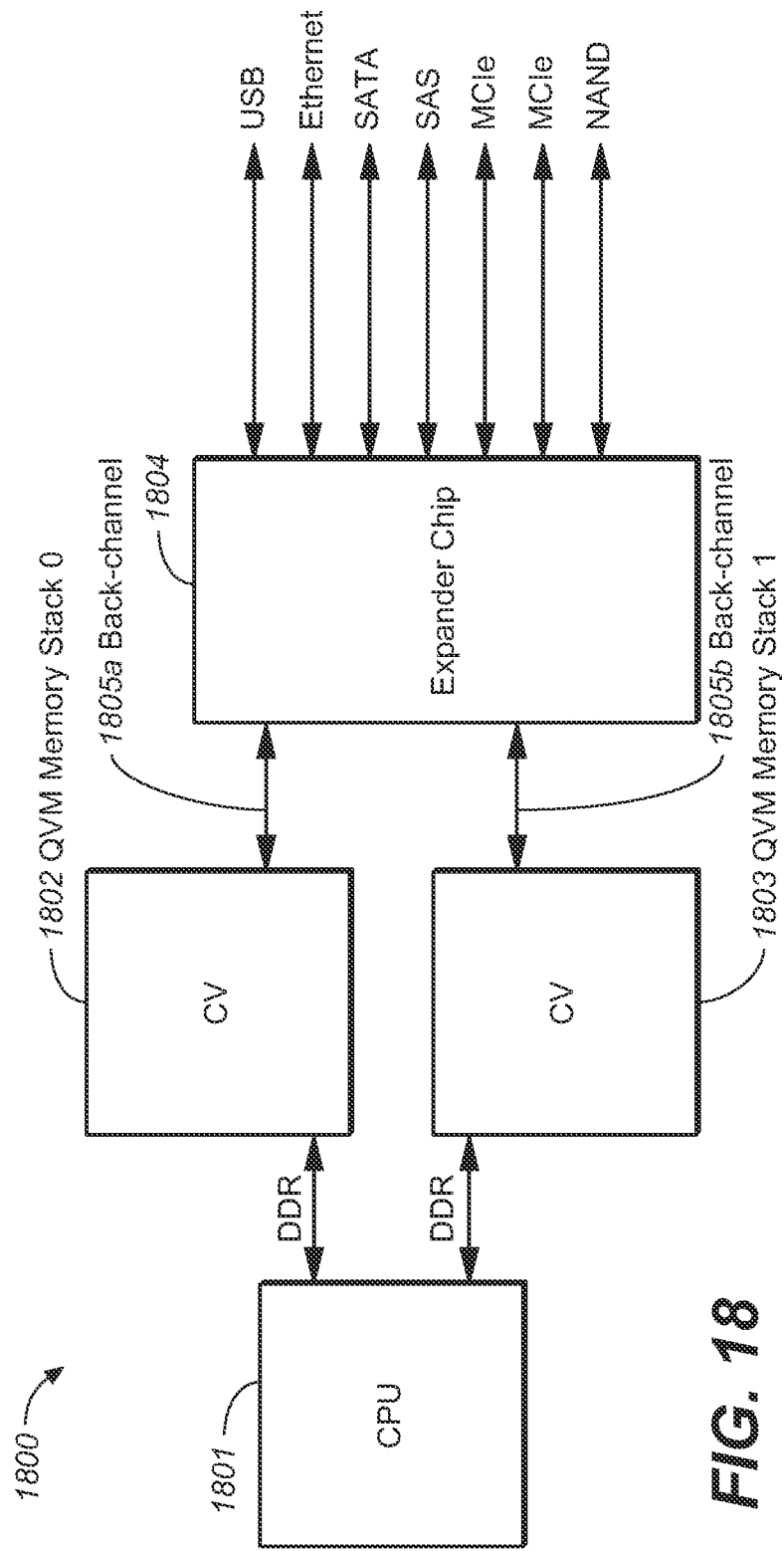
FIG. 18 illustrates, in computer system 1800, memory interface expander 1804 providing a collection of standard peripheral interfaces from which a user may select for a back channel, in accordance with one embodiment of the present invention.

The back channels of the present invention present challenges relating to compatibility with the pin-outs and connector-tie-ins under conventional packaging standards. For example, one may provide a special hardware block for implementing several industry standard interfaces, such that the memory controller incorporating this special hardware block may provide these interfaces in the back channel, thereby allowing such a back channel to have programmable conventional communication and control. Alternatively, even though almost any interface that can be a bus master is suitable for use in a back channel of the present invention, a customized interface in the back channel that allows the memory stack to communicate more broadly may be preferable. FIG. 18 illustrates, in computer system 1800, memory interface expander 1804 providing a collection of standard peripheral interfaces from which a user may select for a back channel, in accordance with one embodiment of the present invention. As shown in FIG. 18, the memory arrays of QV memory stacks 1802 and 1803 are each accessed by CPU 1801 over a conventional DDR memory interface bus. In the back channel, memory interface expander 1804 communicates with the memory arrays of QV memory stacks 1802 and 1803 each over any suitable custom interface bus, represented in FIG. 18 by back channel bus 1805a and 1805b, respectively. To avoid a memory bottleneck, back channel buses 1805a and 1805b should preferable each be a wide and fast bus. Memory interface expander 1804 may communicate with any device over a corresponding one from a collection of industry standard interfaces. FIG. 18 shows the following eligible industry standard interfaces: USB, Ethernet, SATA, SAS, MCIe, and NAND. Memory expander 1804 translates between the signals in the selected interface and the signals in back channel bus 1805a and 1805b.

The back channel of the present invention removes virtually most hardware control and data flow management from the host CPU, leaving the host CPU "an island of compute," and moves most device control functions to one or more QV memory memory controllers. A higher memory capacity is demanded from the host CPU that has become more compute-oriented. This demand is at least partially satisfied by a higher density QV memory. As more memory stacks become available to service the host CPU or CPUs, additional processing power may be desired in the back channels to take full advantage of the memory stacks. This additional processing power allows the back channel to grow in capability (e.g., to serve as a clustered controller). Such development may lead to more sophisticated distributed operating systems.

The present invention thus enables new applications for computers and servers (e.g., high-speed memory buses, as described above). The back channel may also be used in wireless applications, as the back channel can readily support a wireless interface. For example, a microwave wireless connection to the QV memory enables more direct and dynamically reconfigurable connections for data transfers over great distances. Such wireless capability allows any source to perform direct memory-to-memory, memory-to-disk or disk-to-memory transfers, without intervention by a host CPU. With this capability a master control may dynamically alter channel assignments, virtually eliminating tradition bottlenecks in Host and disk channel assignments.

The above detailed description is provided to illustrate specific embodiments of the present invention and is not intended to be limiting, numerous variations and modifications within the scope of the present invention are possible. The present invention is set forth with the following claims.

We claim:

1. A memory module, comprising:
   an internal bus;
   a first memory-mapped device coupled to the internal bus, the first memory-mapped device comprising a controller and a plurality of memory circuits, the controller and the memory circuits each being provided on a semiconductor die, each semiconductor die being bonded to another one of the semiconductor dies, wherein each memory circuit comprises (i) one or more three-dimensional memory arrays; and (ii) a plurality of interconnect conductors which communicate data and control signals between the controller and the memory circuit, such data and control signals being associated operations of the memory circuit; and a second memory-mapped device coupled to the internal bus bus, wherein the internal bus communicates data and control signals between the controller and the second memory-mapped device, such data and control signals being associated with the operations of the second memory-mapped device.

2. The memory module of claim 1, wherein the semiconductor dies of the memory circuits include a plurality of through-silicon vias provided for routing the data and control signals associated with the operations of each memory circuit between the controller and the interconnect conductors of the memory circuit.

3. The memory module of claim 1, wherein the controller controls data exchange between the second memory-mapped device and the memory circuits.

4. The memory module of claim 3, further comprises a direct memory access (DMA) circuit wherein, under the control of the controller, the DMA circuit carries out the data exchange.

5. The memory module of claim 4, further comprising a multi-ported interface circuit over which the data exchange takes place.

6. The memory module of claim 1, wherein the second memory-mapped device also comprises a controller and a plurality of memory circuits.

7. The memory module of claim 1, wherein the second memory-mapped device further comprises a device controller.

8. The memory module of claim 1, wherein the second memory-mapped device comprises one or more of: a non-volatile memory (NVM) system, a disk storage system, a peripheral interface, and a data network.

9. The memory module of claim 8, wherein the NVM system comprises a NAND-type flash memory device.

10. The memory module of claim 8, wherein the controller maintains in the memory circuits a look-up table that assigns a numeric identifier to each file stored in the NVM system.

11. The memory module of claim 10, wherein the controller maintains an address translation table in the memory circuits that maps the numeric identifier of each file to one or more locations in the NVM system.

12. The memory module of claim 8, wherein the NVM system stores files based on a virtualized file system.

13. The memory module of claim 12, wherein the virtualized file system stores overhead files in designated overhead locations of the NVM system.

14. The memory module of claim 13, wherein one or more circular storage areas are maintained in portions of NVM system outside of the designated overhead locations.

15. The memory module of claim 8, wherein a data network comprises an ethernet controller.

16. The memory module of claim 8, wherein the data network comprises a wireless network interface.

17. The memory module of claim 8, wherein the peripheral interface comprises a PCIe interface.

18. The memory module of claim 1, wherein the controller comprises a RISC processor.

19. The memory module of claim 1, further comprising a format circuit which, under control of the controller, converts between data formats used in the memory circuits and the second memory-mapped device.

20. The memory module of claim 1, wherein the controller comprises one or more logic circuits formed out of field programmable gate arrays (FPGAs).

21. The memory module of claim 1, wherein the controller further comprises a host memory interface over which a host processor requests transactions to be carried out by the controller.

22. The memory module of claim 21, wherein the requested transactions include transactions performed in the second memory-mapped device under control of the controller without intervention by the host processor.

23. The memory module of claim 21, wherein the controller performs journaling on requested transactions related to the memory circuits.

24. The memory module of claim 21, wherein the controller performs checkpointing on requested transactions related to the memory circuits.

25. The memory module of claim 21, wherein, for each requested transaction, the controller records in the memory circuits one or more corresponding status codes each representing a progress status of the requested transaction, as the requested transaction proceeds.

26. The memory module of claim 25, wherein the requested transactions and the corresponding status codes are recorded in circular buffers allocated in the memory circuits.

27. The memory module of claim 1, further comprising an encryption circuit and a decryption circuit, the encryption circuit and the decryption circuit, under control of the controller, encrypt and decrypt data to be stored or to be retrieved from the memory circuits.

28. The memory module of claim 1, further comprising a data compression circuit and a data decompression circuit, the data compression circuit and the data decompression circuit, under control of the controller, compress and decompress data to be stored or to be retrieved from the memory circuits.

29. The memory module of claim 1, further comprising an error correction code generation circuit and an error correction circuit, the error correction code generation circuit and the error correction circuit, under control of the controller, generate error correction codes to accompany data to be stored into the memory circuits and for correcting data retrieved from the memory circuits based on the accompanying error correction codes.

30. The memory module of claim 29, further comprising an error logging circuit that detects and log each error event arising whenever the error correction circuit corrects data retrieved from the memory circuits.

31. The memory module of claim 30, wherein the controller further comprises a refresh circuit that refreshes the data stored in the memory circuits, and wherein the error logging in one of the memory circuit is carried out concurrently when that memory circuit is refreshed by the refresh circuit.

32. The memory module of claim 31, wherein the memory circuits include redundant quasi-volatile (QV) memory cells and wherein QV memory cells in the memory circuits are mapped to the redundant cells according to the error events.

33. The memory module of claim 1, wherein the internal bus is provided on an interposer substrate on which the first and the second memory-mapped devices are mounted.

34. The memory module of claim 33, wherein the controller further comprises a host memory interface over which a host processor requests transactions to be carried out by the controller and wherein the host processor is also bonded to the interposer substrate.

35. The memory module of claim 34, wherein the interposer substrate provides interconnect conductors to electrically connect the host processor to the host processor interface.

36. The memory module of claim 34, wherein the interposer substrate have further bonded thereon additional semiconductor dies each having formed thereon additional circuitry, wherein the interposer substrate provides interconnect conductors to interconnect the memory module, the host processor and the additional circuitry of the additional semiconductor dies.

37. The memory module of claim 36, wherein the additional circuitry comprises a graphics processor unit (GPU).

38. The memory module of claim 36, wherein the additional circuitry comprises a field programmable gate array (FPGA) circuit.

39. The memory module of claim 36, wherein the additional circuitry further comprises an industry standard interface circuit.

40. The memory module of claim 1, wherein the memory module is provided in a ball-grid array integrated circuit package.

* * * * *